(12) United States Patent
Kitajima et al.

(10) Patent No.: US 12,725,998 B2
(45) Date of Patent: Sep. 1, 2026

(54) LIGHT-EMITTING DEVICE

(71) Applicant: NICHIA CORPORATION, Anan (JP)

(72) Inventors: Tadayuki Kitajima, Itano-gun (JP); Soichiro Miura, Tokushima (JP); Munetake Fukunaga, Tokushima (JP); Yusuke Mori, Anan (JP)

(73) Assignee: NICHIA CORPORATION, Anan (JP)

( * ) Notice: Subject to any disclaimer, the term of this patent is extended or adjusted under 35 U.S.C. 154(b) by 514 days.

(21) Appl. No.: 18/473,012

(22) Filed: Sep. 22, 2023

(65) Prior Publication Data

US 2024/0113492 A1 Apr. 4, 2024

(30) Foreign Application Priority Data

Sep. 29, 2022 (JP) ................................ 2022-157196

(51) Int. Cl.
*H01S 5/00* (2006.01)
*H01S 5/02315* (2021.01)

(52) U.S. Cl.
CPC ........ *H01S 5/0087* (2021.01); *H01S 5/02315* (2021.01)

(58) Field of Classification Search
CPC .......................... H01S 5/0087; H01S 5/02315
See application file for complete search history.

(56) References Cited

U.S. PATENT DOCUMENTS

2006/0291246 A1 12/2006 Hattori et al.
2008/0169752 A1 7/2008 Hattori et al.
2013/0146930 A1* 6/2013 Toda .................. C09K 11/7701 252/301.4 R
2015/0009703 A1 1/2015 Morizumi et al.
2017/0256685 A1 9/2017 Schug
2018/0087726 A1* 3/2018 Yamashita .......... H01S 5/02255
2019/0081452 A1 3/2019 Miura et al.
2022/0231479 A1 7/2022 Raring et al.
2023/0318254 A1* 10/2023 Miura .................. H01S 5/0087 372/44.01
2023/0411360 A1* 12/2023 Miura ................ H10H 20/8515

FOREIGN PATENT DOCUMENTS

JP 2007-005483 A 1/2007
JP 2008-177227 A 7/2008
JP 2014-192127 A 10/2014
JP 2015-029034 A 2/2015
JP 2017-068923 A 4/2017
JP 2017-526192 A 9/2017
JP 2019-053130 A 4/2019
WO WO-2021/085164 A1 5/2021

* cited by examiner

*Primary Examiner* — Yuanda Zhang
(74) *Attorney, Agent, or Firm* — Foley & Lardner LLP

(57) ABSTRACT

A light-emitting device includes a semiconductor laser element, a wavelength conversion member, and a package. The wavelength conversion member includes a wavelength conversion portion and a reflective portion. The wavelength conversion portion includes a light incident surface and a light-emitting surface. The package includes a disposition region. The wavelength conversion member is disposed at a position away in a first direction from a position at which the semiconductor laser element is disposed. The light-emitting surface has a shape that, in a plan view perpendicular to the light-emitting surface, has a first region decreasing in width in a second direction perpendicular to the first direction from the side closest to the semiconductor laser element toward the first direction.

16 Claims, 33 Drawing Sheets

LIGHT-EMITTING DEVICE

CROSS-REFERENCE TO RELATED APPLICATIONS

The present application is based on and claims priority to Japanese Patent Application No. 2022-157196 filed on Sep. 29, 2022, the entire contents of which are hereby incorporated by reference.

BACKGROUND

The present disclosure relates to a light-emitting device.

Japanese Patent Publication No. 2019-53130 discloses a light-emitting device including: a semiconductor laser element; a reflective body configured to reflect upward light emitted from the semiconductor laser element; a light-transmissive body through which the light reflected by the reflective body passes; and a wavelength conversion member on which the light emitted from the light-transmissive body is incident.

SUMMARY

The present disclosure realizes a light-emitting device that includes a semiconductor laser element and a wavelength conversion member, and can be produced at a lower cost.

Alternatively or additionally to the above, the present disclosure realizes a light-emitting device that includes a semiconductor laser element and a wavelength conversion member, and includes a smaller number of parts that constitute the light-emitting device.

Alternatively or additionally to the above, the present disclosure realizes a light-emitting device that includes a semiconductor laser element and a wavelength conversion member, and can be produced by a simpler production process.

A light-emitting device disclosed in one embodiment includes a semiconductor laser element, a wavelength conversion member, and a package. The wavelength conversion member includes a wavelength conversion portion and a reflective portion. The wavelength conversion portion includes: a light incident surface that is a lateral surface on which light emitted from the semiconductor laser element is incident; and a light-emitting surface that is an upper surface from which light converted in wavelength is emitted, the light converted in wavelength being obtained by converting a wavelength of the light emitted from the semiconductor laser element. The reflective portion is provided on a surface of the wavelength conversion member, the surface not including the light incident surface and the light-emitting surface of the wavelength conversion portion. The reflective portion is configured to reflect: the light emitted from the semiconductor laser element and incident on the wavelength conversion portion; and the light converted in wavelength by the wavelength conversion portion. The package includes a disposition region where the semiconductor laser element and the wavelength conversion member are disposed, and forms an inner space in which the semiconductor laser element and the wavelength conversion member are disposed. The wavelength conversion member is disposed at a position away in a first direction from a position at which the semiconductor laser element is disposed. The light-emitting surface has a shape that, in a plan view perpendicular to the light-emitting surface, has a first region decreasing in width in a second direction perpendicular to the first direction from the side closest to the semiconductor laser element toward the first direction.

According to at least one embodiment disclosed herein, the above-described light-emitting device is realized.

DETAILED DESCRIPTION

Figure 1:
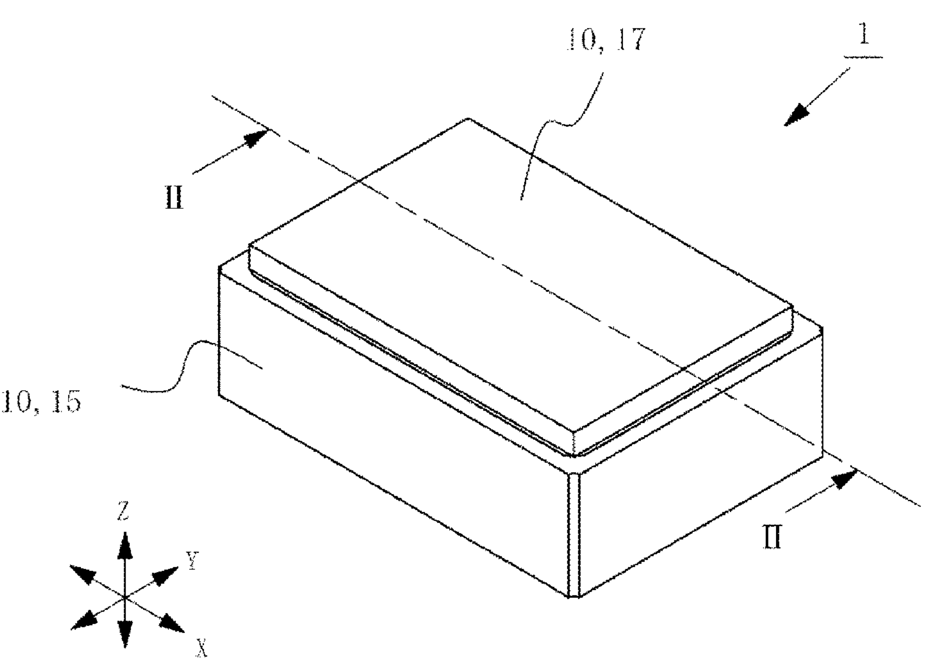
FIG. 1 is a perspective view of a light-emitting device according to embodiments.

In the present specification and the claims, as for polygons such as triangles and quadrangles, polygons with rounded corners, beveled corners, angled corners, reverse-rounded corners are also referred to as polygons. Likewise, not only shapes with such modification at corners (end of sides) but also shapes with modifications at intermediate portions of sides of the shapes are also referred to as polygons. That is, shapes based on polygons with partial modification are also interpreted as “polygons” in the present specification and the claims.

Such interpretation is applied not only to polygons but also applies to terms denoting specific shapes such as trapezoids, circles, projections, and recesses. The same applies to sides forming such shapes. That is, even if an end or an intermediate portion of a side is modified, the modified portion is interpreted as a portion of a “side.” When “polygons” and “sides” without such modified portions are intended to be distinguished from those with modifications, the term “exact” is added, such as an “exact quadrangle.”

Also, in the present specification and the claims, such terms as “top and bottom (above/below),” “left and right,” “front face and rear face,” “back and forth (backward/forward),” and “front and back” just describe relative relationships of, for example, positions, orientations, and directions, and do not necessarily match actual relationships in use.

Also, in the drawings, directions such as an X direction, a Y direction, and a Z direction may be indicated by arrows. Directions of these arrows are consistent between a plurality of drawings according to the same embodiment. Also, in the drawings, the directions indicated by the arrows with X, Y, and Z are positive directions, and the opposite directions thereto are negative directions. For example, the direction indicated by the arrow with X at the tip thereof is the X direction and the positive direction. Note that a direction that is the X direction and the positive direction is referred to as a “positive X-direction,” and the opposite direction thereto is referred to as a “negative X-direction.” The same applies to the Y direction and Z direction.

Also, in the present specification, the terms “member” and “portion” may be used, for example, when components are described. The term “member” refers to an object that is physically treated as a single body. The object that is physically treated as a single body can also be an object that is treated as a single part in a production process. Meanwhile, the term “portion” refers to an object that is not necessarily physically treated as a single body. For example, the term “portion” is used, for example, when a part of a single member is treated or when a plurality of members is collectively treated as a single object.

Note that use of the above different terms, “member” and “portion”, is not intended to intentionally limit the claimed scope in the interpretation of the doctrine of equivalents. Specifically, even if there is a component expressed by the term “member” in the claims, the applicant does not necessarily imply only from the use of this term that it is indispensable that this component is physically treated as a single body in the application of the present invention.

Also, in the present specification and the claims, when there are a plurality of certain components and these components are distinguishably expressed, the terms “first” and “second” may be added before those components for distinction. Also, there may be a case in which an object distinguished is different between in the present specification and in the claims. Therefore, even if the claims describe a component having the same labelling term as in the present specification, an object that is specified by this component is not necessarily the same between in the present specification and in the claims.

For example, when the present specification describes components distinguished with “first,” “second,” and “third,” and the components with “first” and “third” in the present specification are described in the claims, those components may be labelled with “first” and “second” in the claims from the viewpoint of readability. In this case, the components with “first” and “second” in the claims respectively refer to the components with “first” and “third” in the present specification. Note that this rule is not only applied to components but also applied to other objects reasonably and flexibly.

Hereinafter, embodiments of the present invention will be described. In more detail, referring to the drawings, specific embodiments of the present invention will also be described. Note that the embodiments of the present invention are not limited to those specific embodiments of the present invention. In other words, the embodiments of the present invention are not only the embodiments that are illustrated in the drawings. Note that the sizes, positional relationships, etc. of the members illustrated in the drawings may be emphasized for the ease of understanding.

EMBODIMENTS

Figure 2:
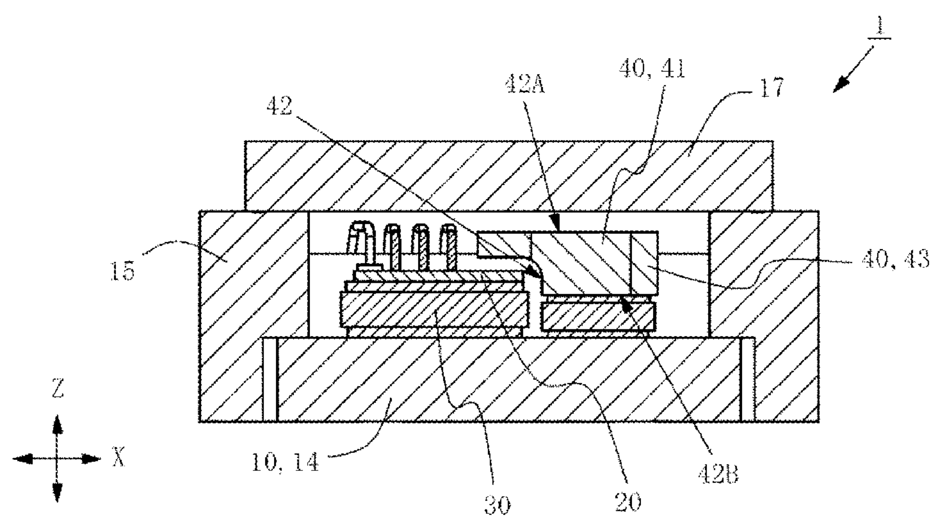
FIG. 2 is a cross-sectional view of FIG. 1 taken along cross-sectional line II-II.
Figure 3A:
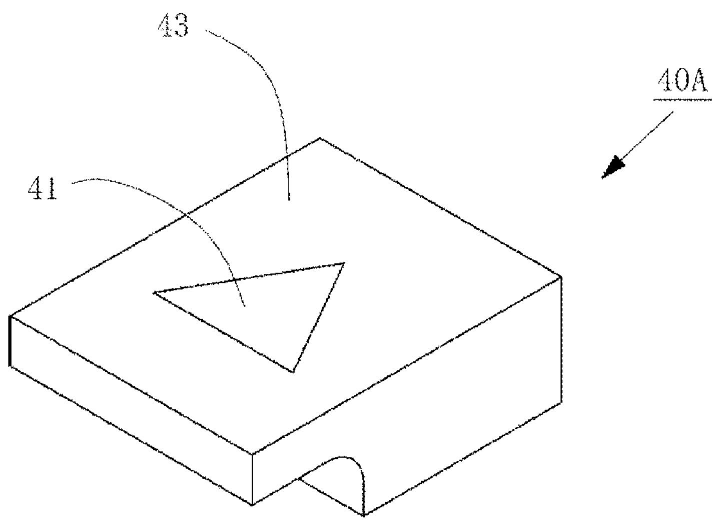
FIG. 3A is a perspective view, from above, of a wavelength conversion member of a first example according to the embodiments.
Figure 3B:
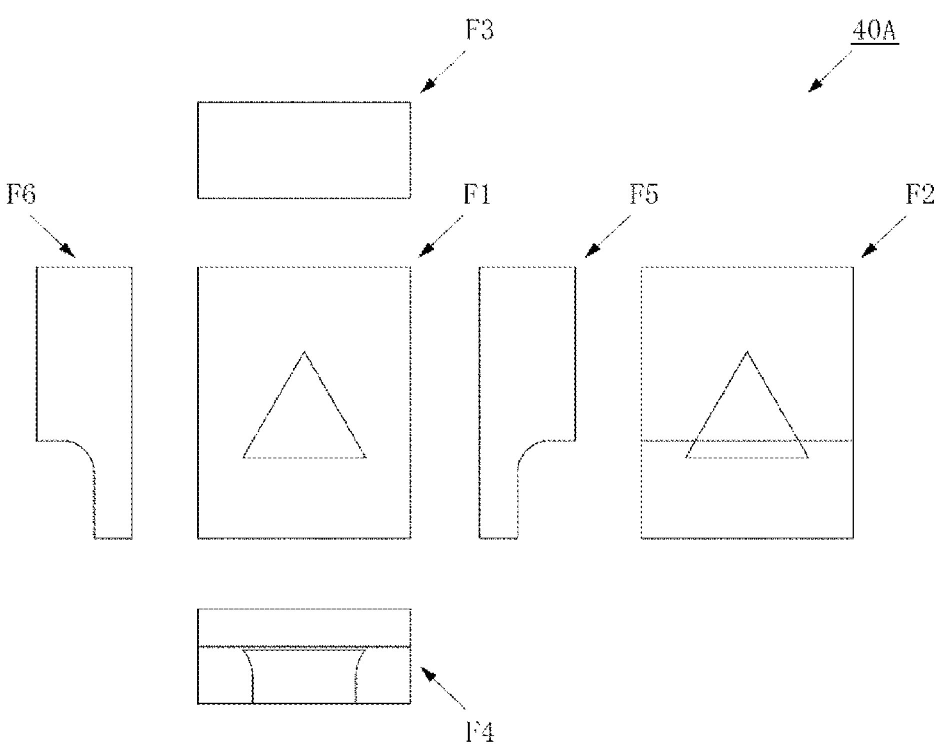
FIG. 3B illustrates six-face views of the wavelength conversion member of the first example according to the embodiments.
Figure 3C:
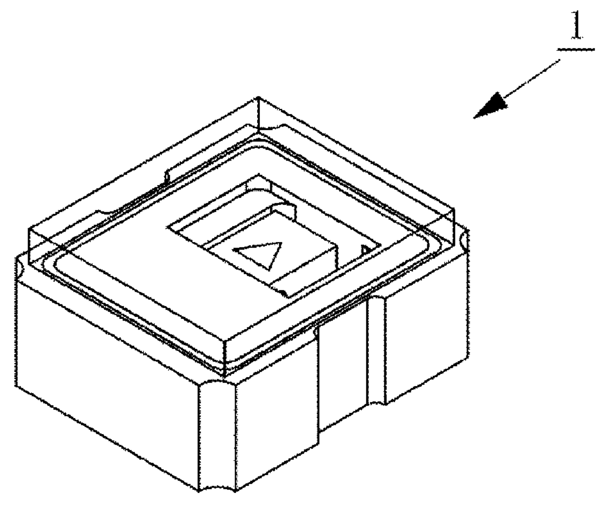
FIG. 3C is a perspective view, from above, of the light-emitting device including the wavelength conversion member of the first example according to the embodiments.
Figure 3D:
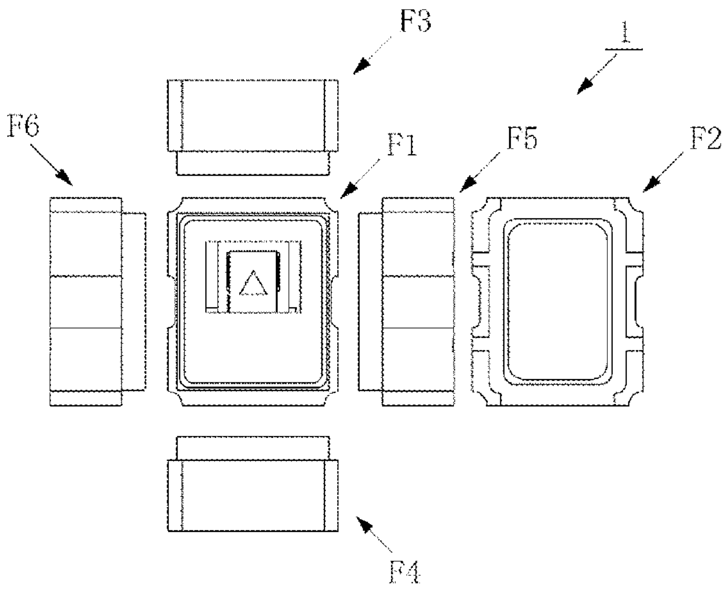
FIG. 3D illustrates six-face views of the light-emitting device including the wavelength conversion member of the first example according to the embodiments.
Figure 4A:
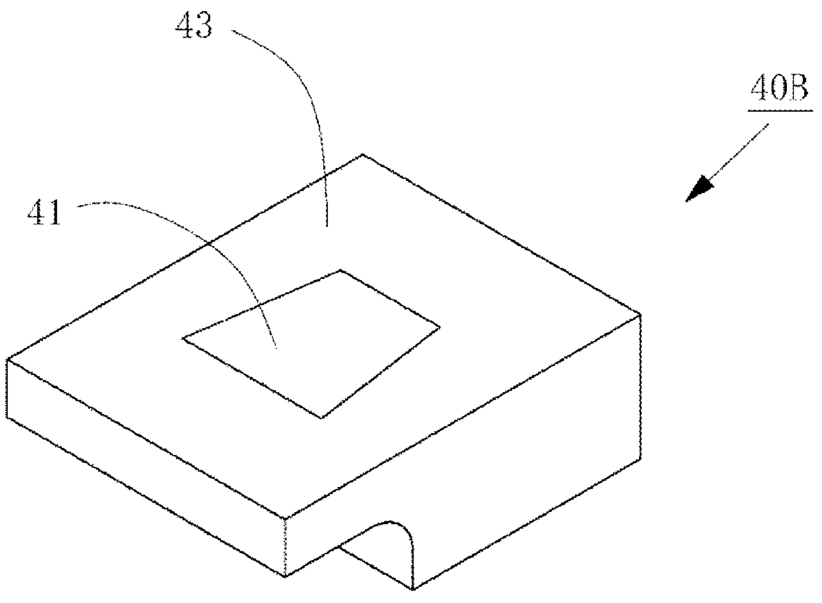
FIG. 4A is a perspective view, from above, of a wavelength conversion member of a second example according to the embodiments.
Figure 4B:
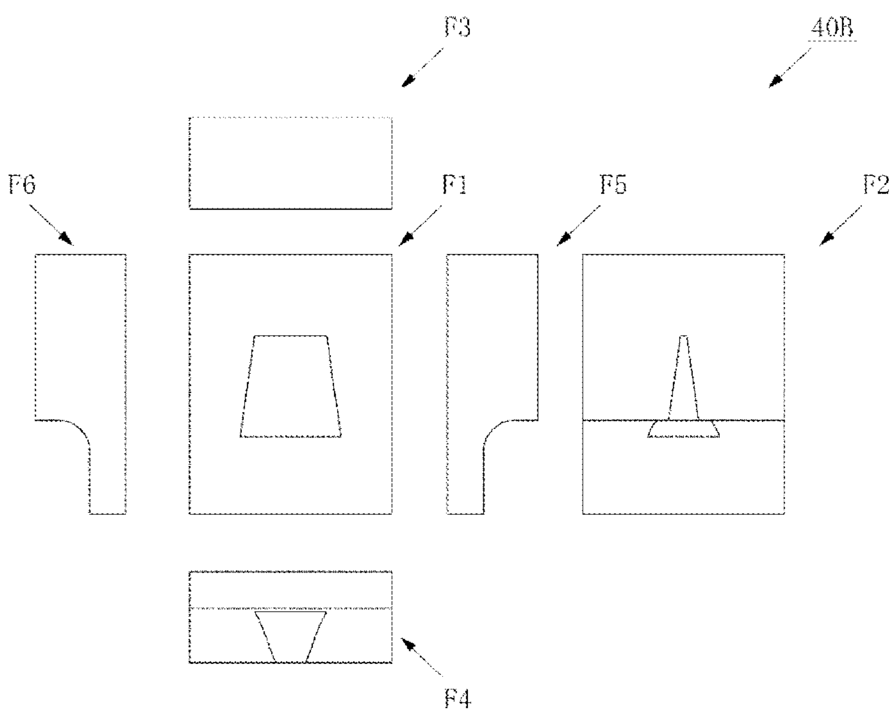
FIG. 4B illustrates six-face views of the wavelength conversion member of the second example according to the embodiments.
Figure 4C:
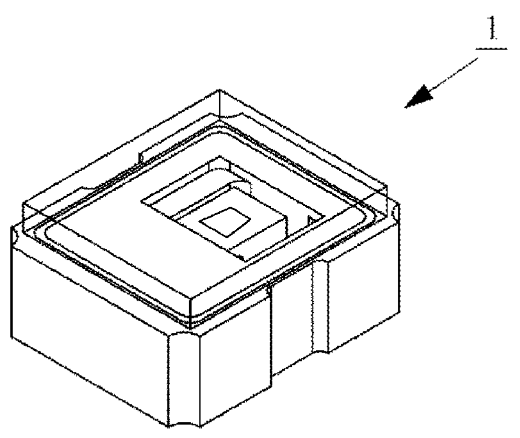
FIG. 4C is a perspective view, from above, of the light-emitting device including the wavelength conversion member of the second example according to the embodiments.
Figure 4D:
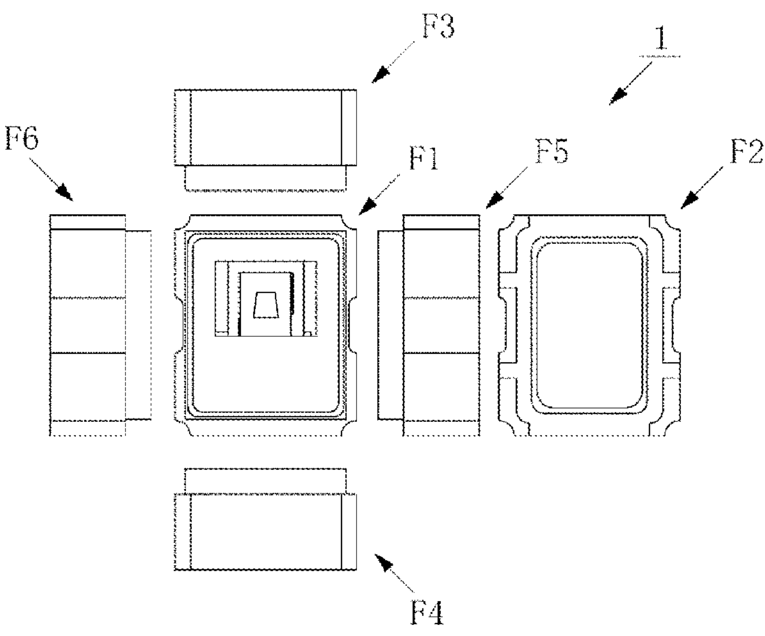
FIG. 4D illustrates six-face views of the light-emitting device including the wavelength conversion member of the second example according to the embodiments.
Figure 5A:
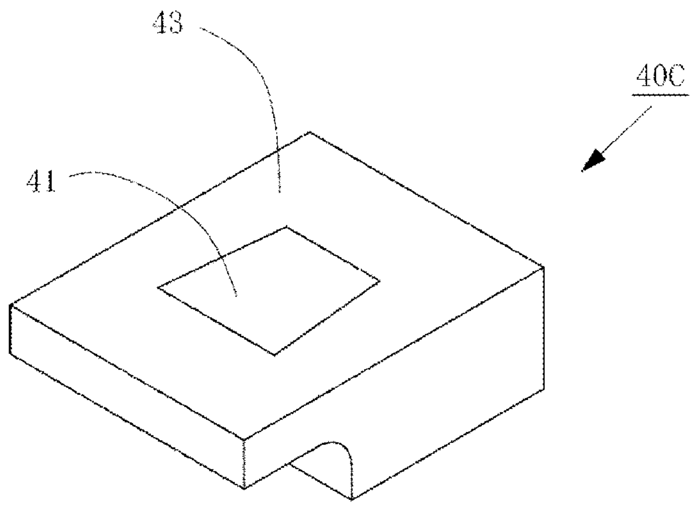
FIG. 5A is a perspective view, from above, of a wavelength conversion member of a third example according to the embodiments.
Figure 5B:
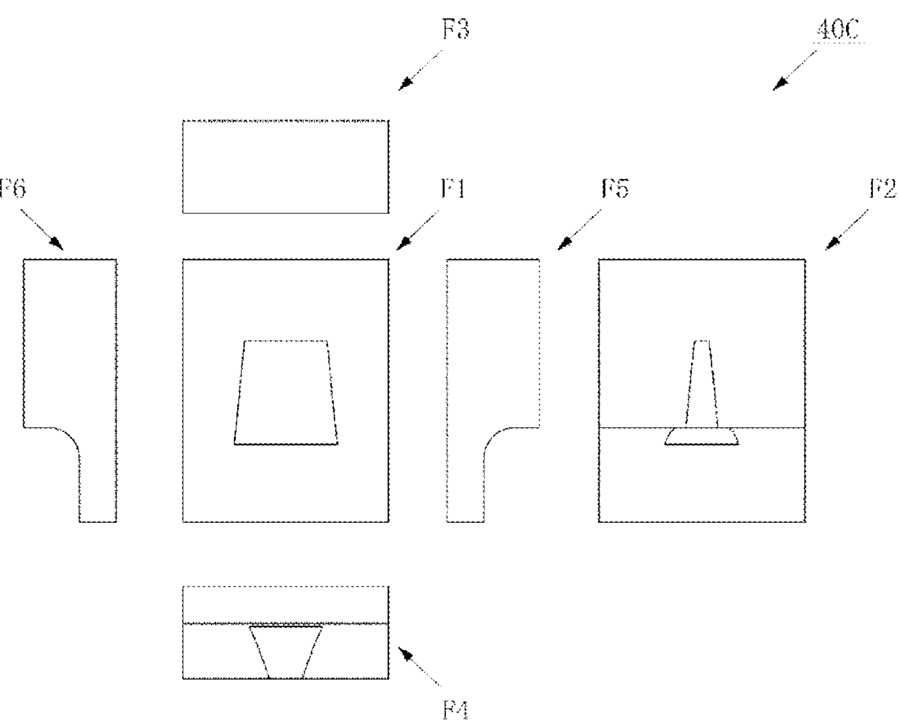
FIG. 5B illustrates six-face views of the wavelength conversion member of the third example according to the embodiments.
Figure 5C:
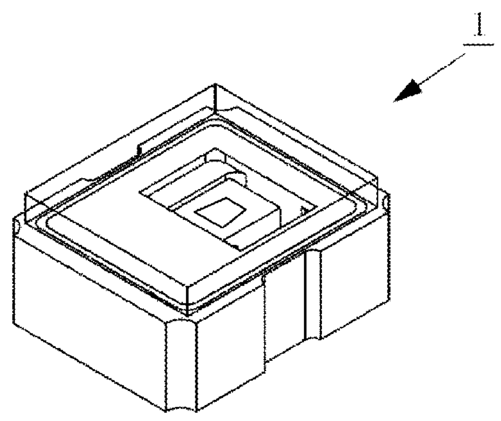
FIG. 5C is a perspective view, from above, of the light-emitting device including the wavelength conversion member of the third example according to the embodiments.
Figure 5D:
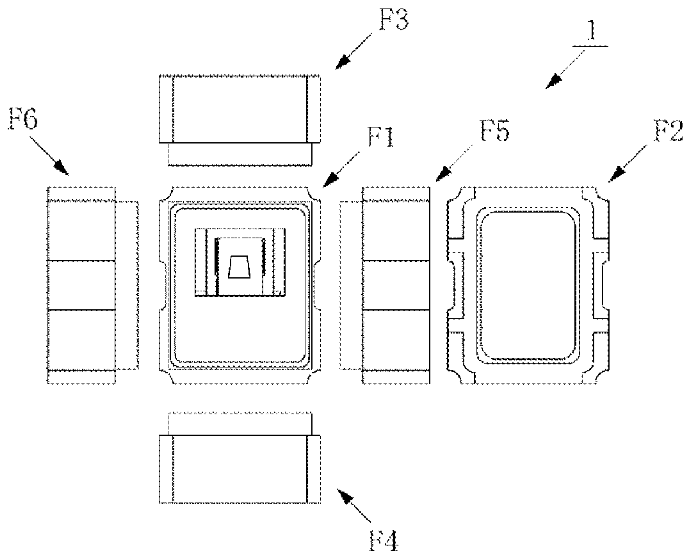
FIG. 5D illustrates six-face views of the light-emitting device including the wavelength conversion member of the third example according to the embodiments.
Figure 6A:
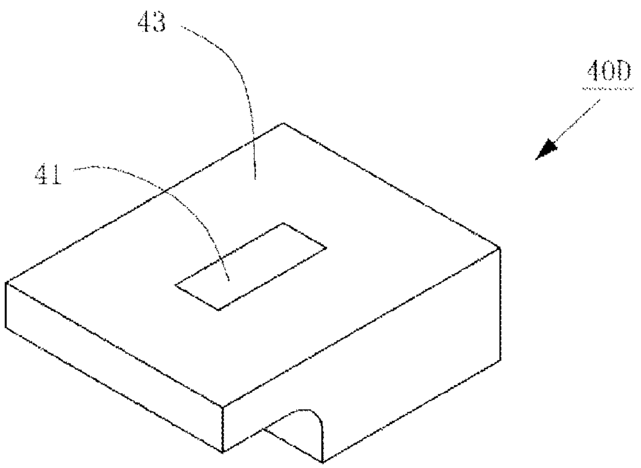
FIG. 6A is a perspective view, from above, of a wavelength conversion member of a fourth example according to the embodiments.
Figure 6B:
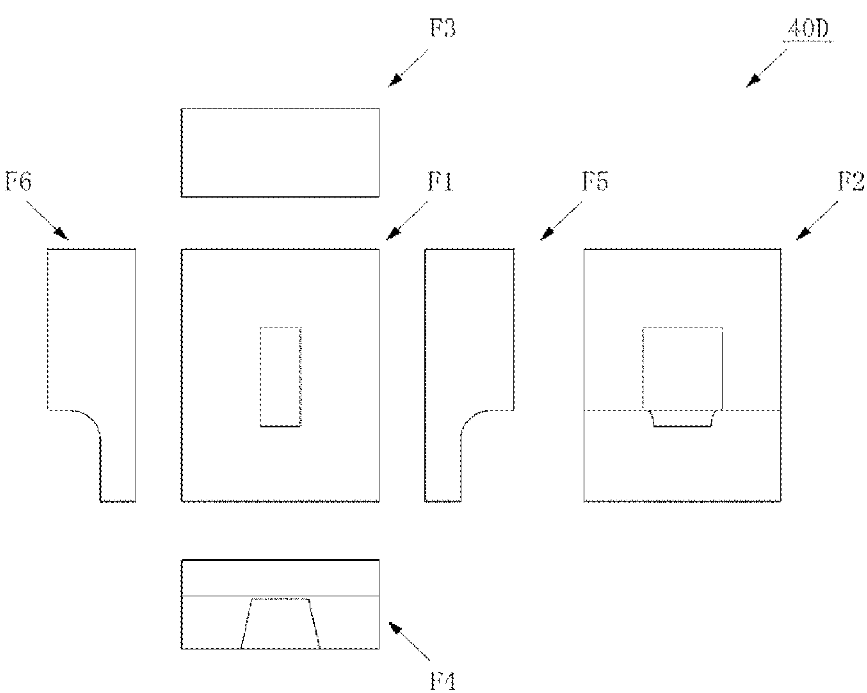
FIG. 6B illustrates six-face views of the wavelength conversion member of the fourth example according to the embodiments.
Figure 6C:
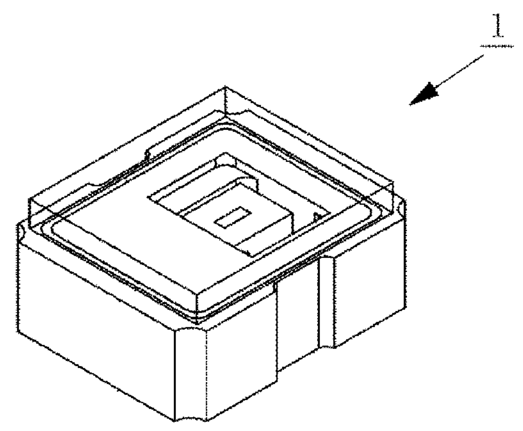
FIG. 6C is a perspective view, from above, of the light-emitting device including the wavelength conversion member of the fourth example according to the embodiments.
Figure 6D:
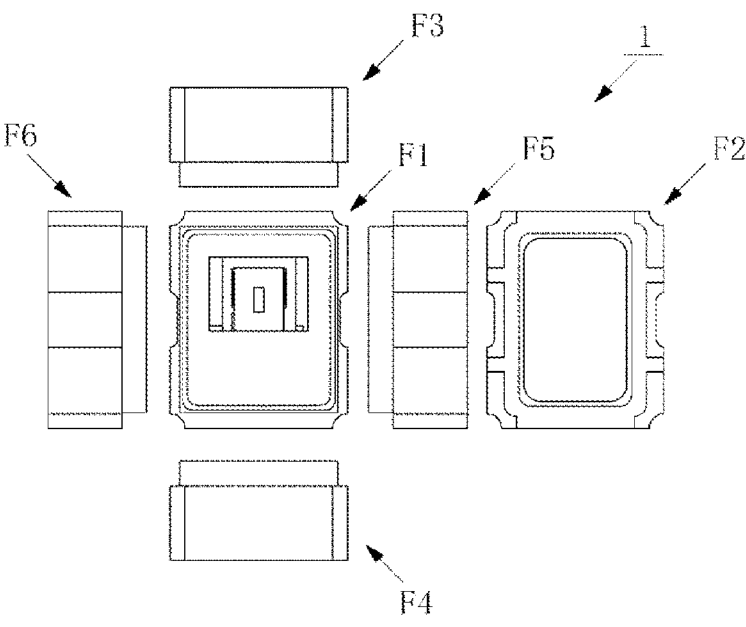
FIG. 6D illustrates six-face views of the light-emitting device including the wavelength conversion member of the fourth example according to the embodiments.
Figure 7A:
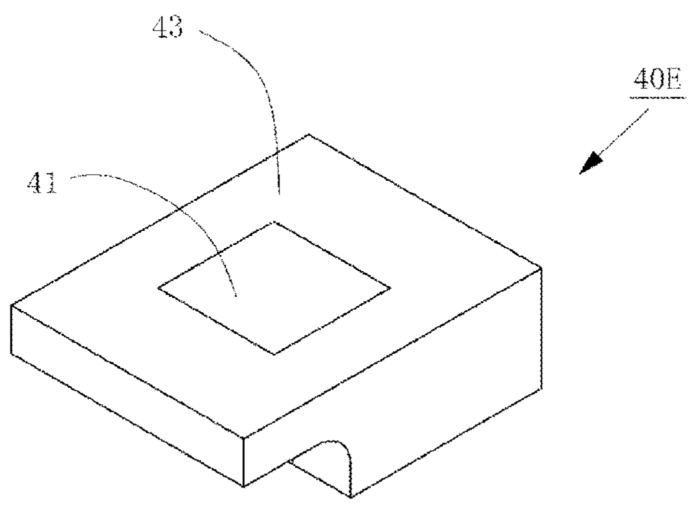
FIG. 7A is a perspective view, from above, of a wavelength conversion member of a fifth example according to the embodiments.
Figure 7B:
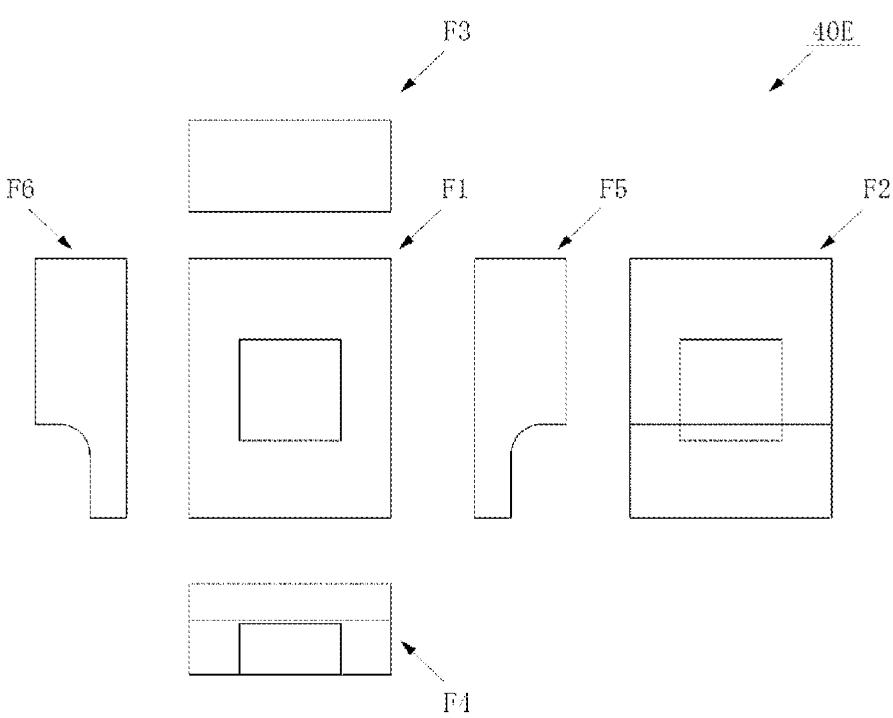
FIG. 7B illustrates six-face views of the wavelength conversion member of the fifth example according to the embodiments.
Figure 7C:
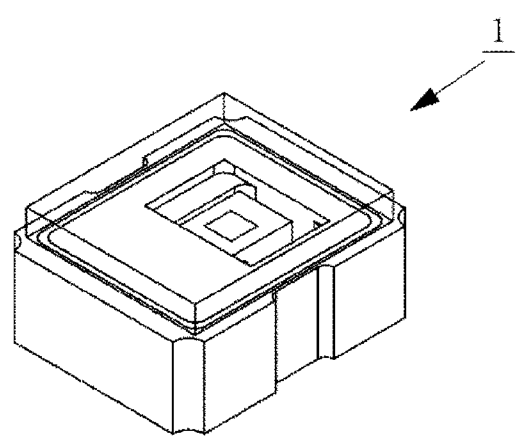
FIG. 7C is a perspective view, from above, of the light-emitting device including the wavelength conversion member of the fifth example according to the embodiments.
Figure 7D:
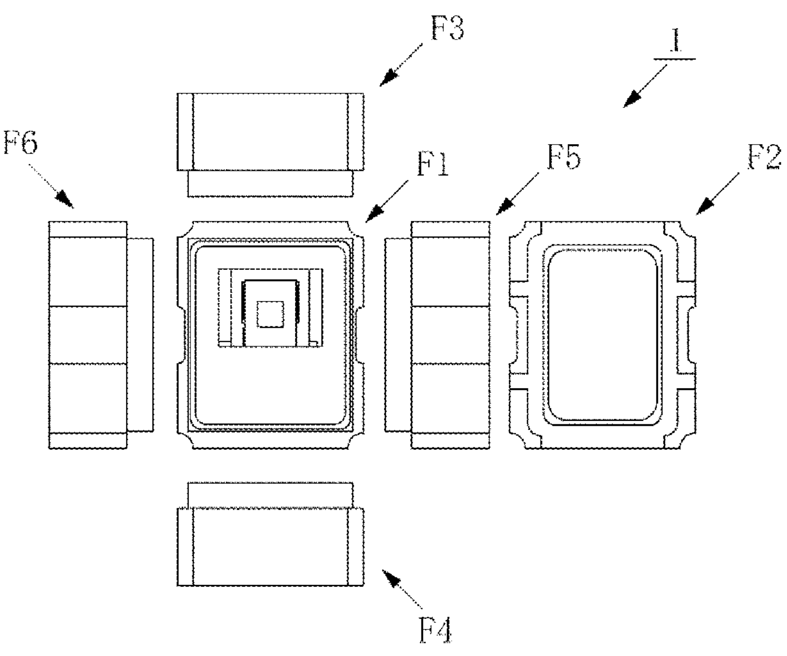
FIG. 7D illustrates six-face views of the light-emitting device including the wavelength conversion member of the fifth example according to the embodiments.
Figure 8A:
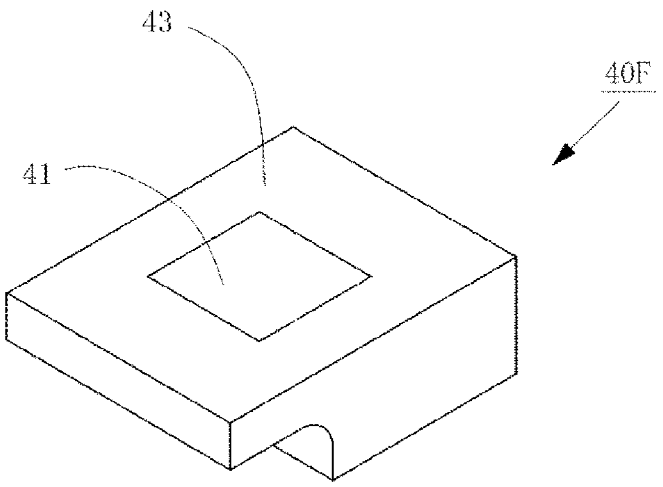
FIG. 8A is a perspective view, from above, of a wavelength conversion member of a sixth example according to the embodiments.
Figure 8B:
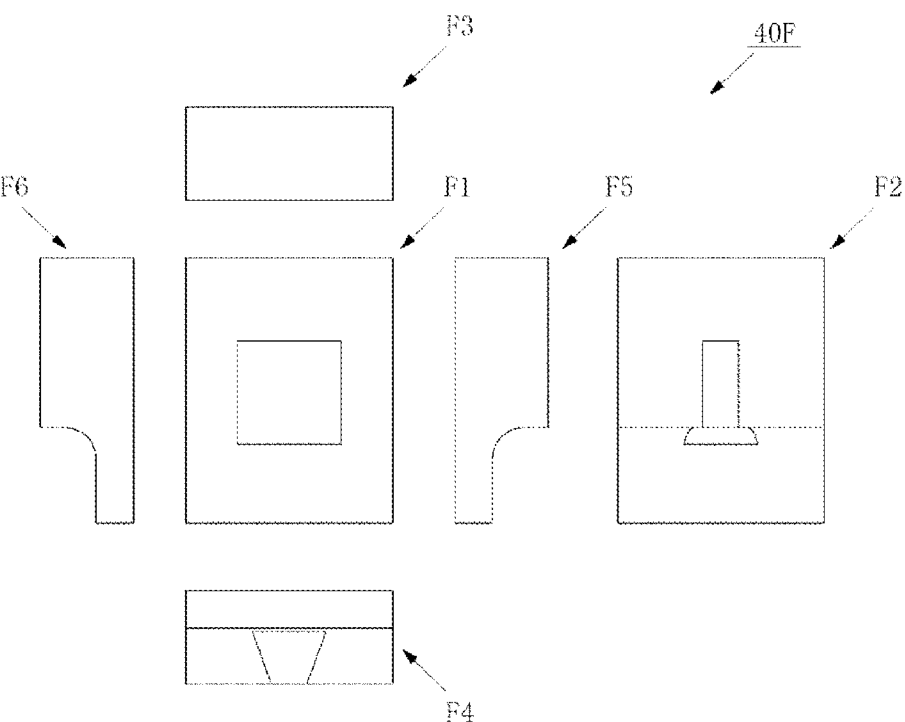
FIG. 8B illustrates six-face views of the wavelength conversion member of the sixth example according to the embodiments.
Figure 8C:
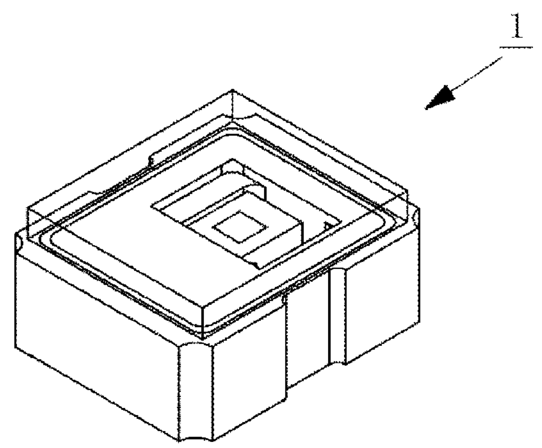
FIG. 8C is a perspective view, from above, of the light-emitting device including the wavelength conversion member of the sixth example according to the embodiments.
Figure 8D:
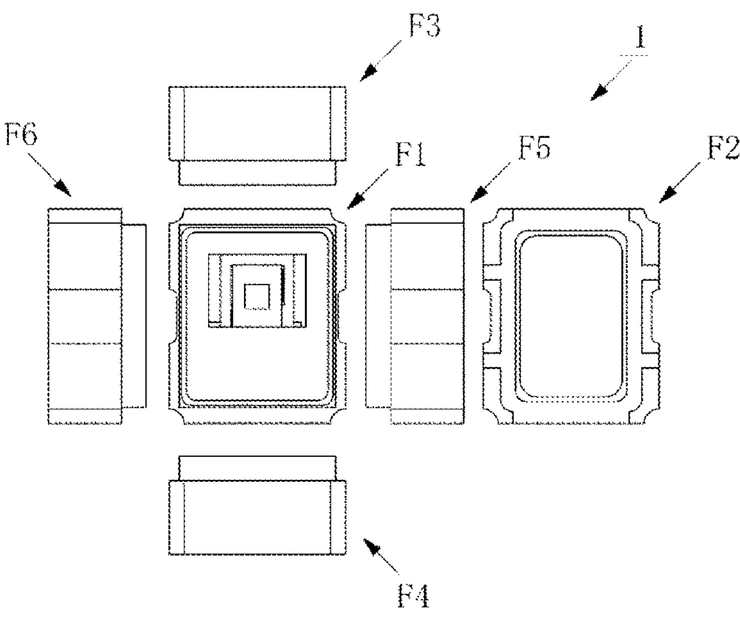
FIG. 8D illustrates six-face views of the light-emitting device including the wavelength conversion member of the sixth example according to the embodiments.
Figure 9A:
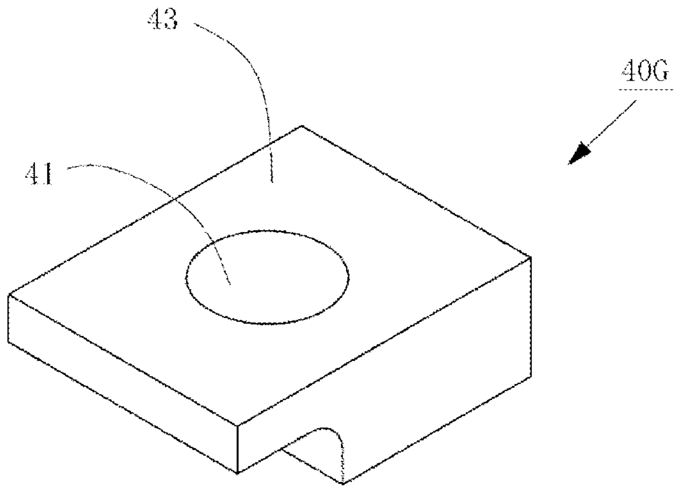
FIG. 9A is a perspective view, from above, of a wavelength conversion member of a seventh example according to the embodiments.
Figure 9B:
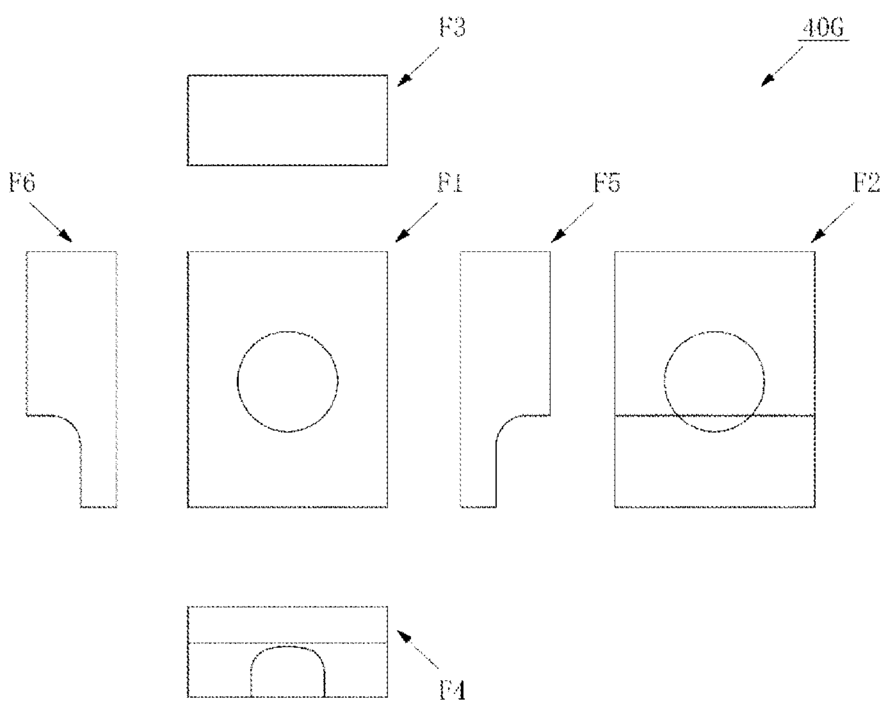
FIG. 9B illustrates six-face views of the wavelength conversion member of the seventh example according to the embodiments.
Figure 9C:
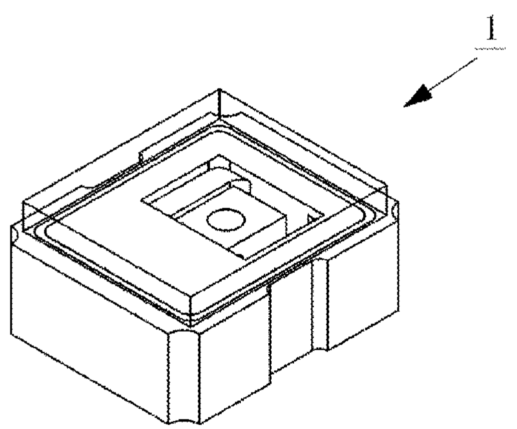
FIG. 9C is a perspective view, from above, of the light-emitting device including the wavelength conversion member of the seventh example according to the embodiments.
Figure 9D:
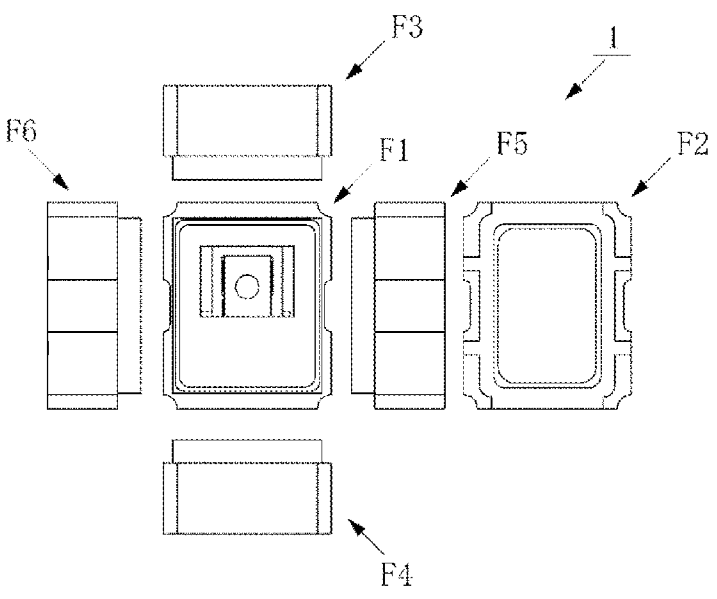
FIG. 9D illustrates six-face views of the light-emitting device including the wavelength conversion member of the seventh example according to the embodiments.
Figure 10A:
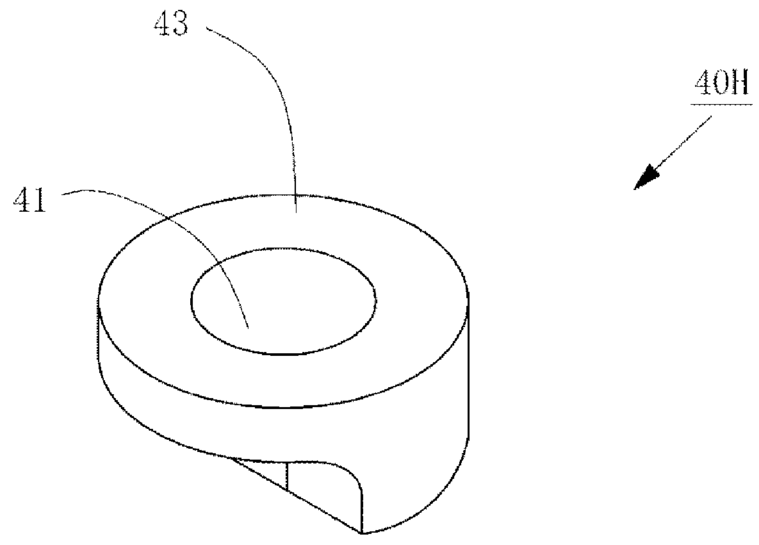
FIG. 10A is a perspective view, from above, of a wavelength conversion member of an eighth example according to the embodiments.
Figure 10B:
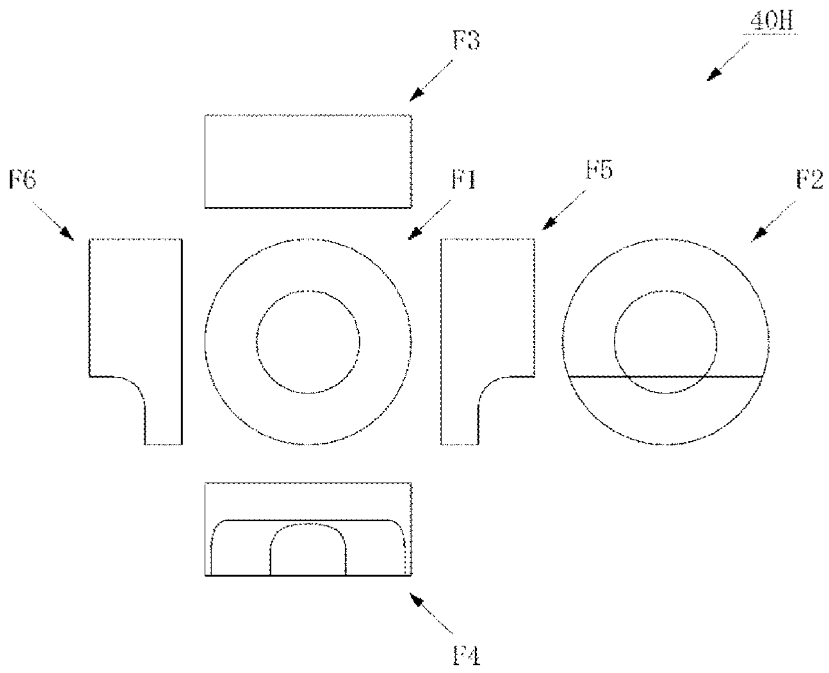
FIG. 10B illustrates six-face views of the wavelength conversion member of the eighth example according to the embodiments.
Figure 10C:
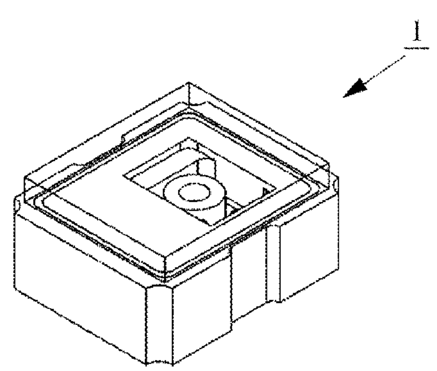
FIG. 10C is a perspective view, from above, of the light-emitting device including the wavelength conversion member of the eighth example according to the embodiments.
Figure 10D:
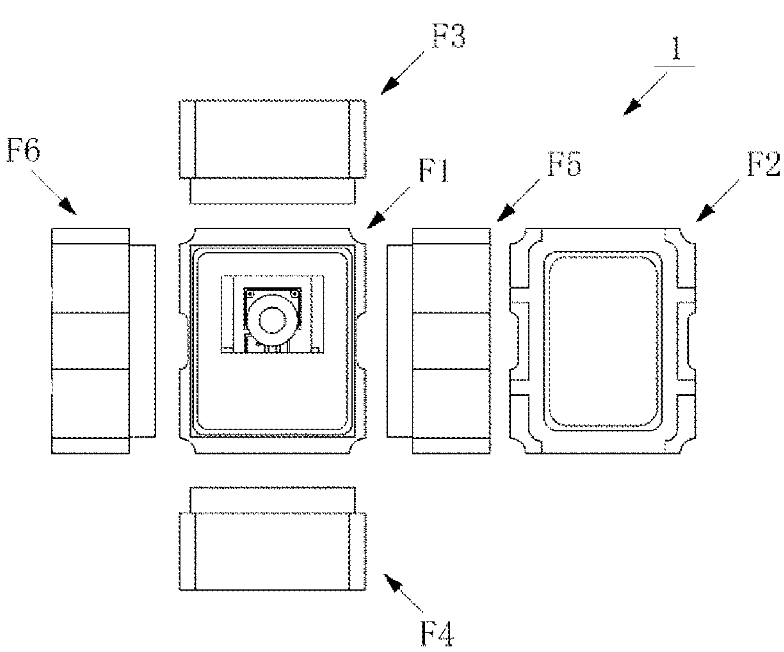
FIG. 10D illustrates six-face views of the light-emitting device including the wavelength conversion member of the eighth example according to the embodiments.
Figure 11A:
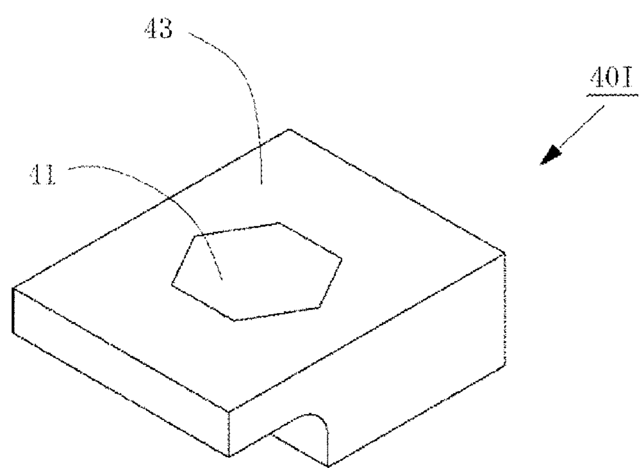
FIG. 11A is a perspective view, from above, of a wavelength conversion member of a ninth example according to the embodiments.
Figure 11B:
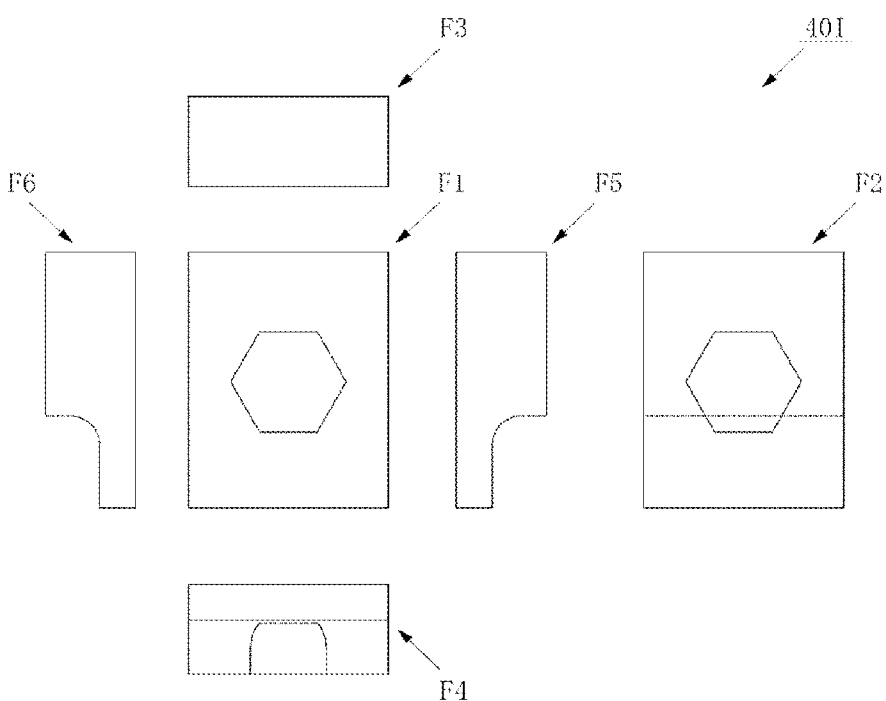
FIG. 11B illustrates six-face views of the wavelength conversion member of the ninth example according to the embodiments.
Figure 11C:
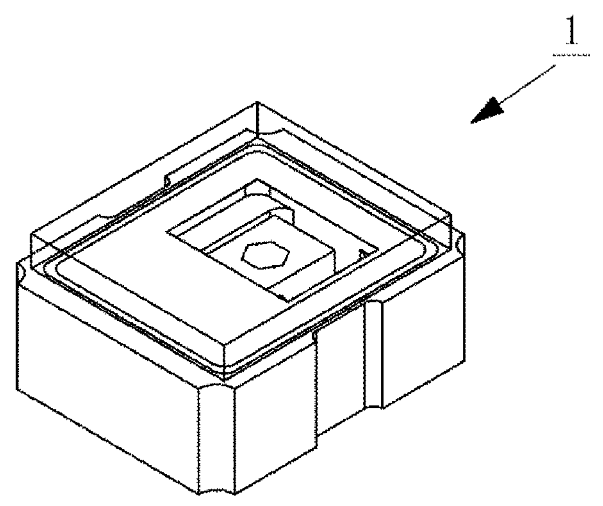
FIG. 11C is a perspective view, from above, of the light-emitting device including the wavelength conversion member of the ninth example according to the embodiments.
Figure 11D:
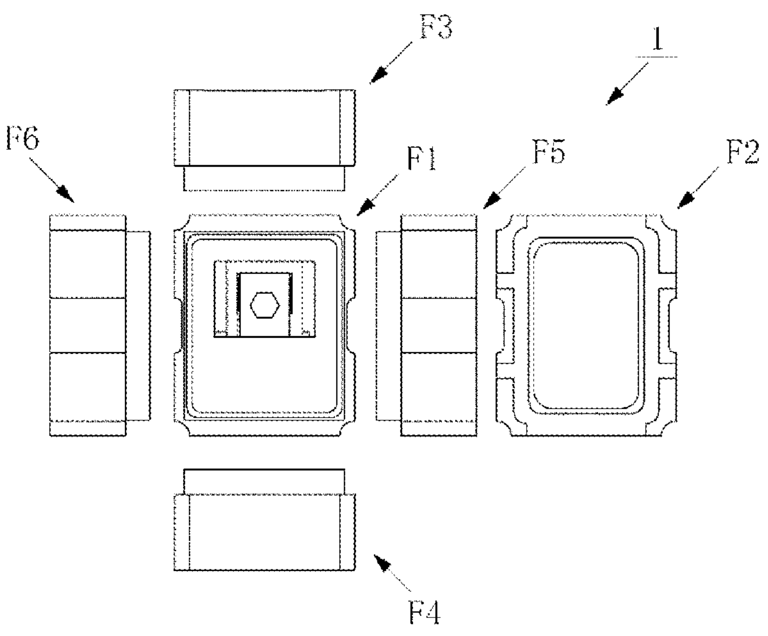
FIG. 11D illustrates six-face views of the light-emitting device including the wavelength conversion member of the ninth example according to the embodiments.
Figure 12A:
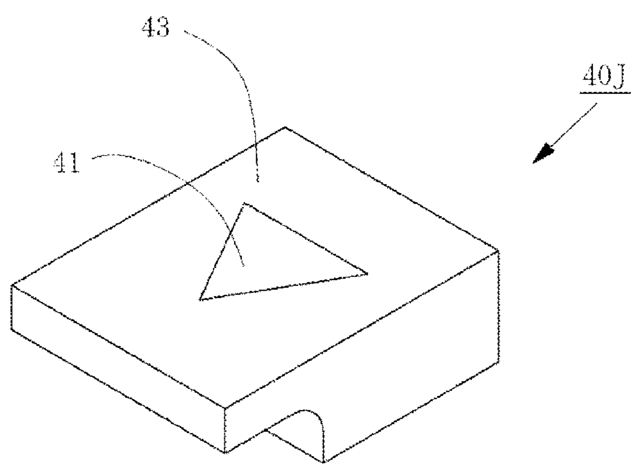
FIG. 12A is a perspective view, from above, of a wavelength conversion member of a tenth example according to the embodiments.
Figure 12B:
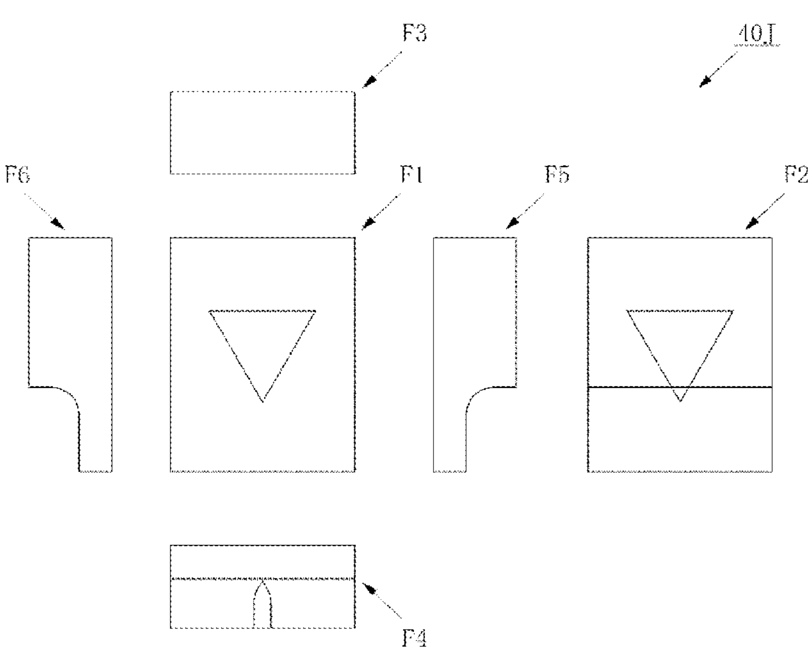
FIG. 12B illustrates six-face views of the wavelength conversion member of the tenth example according to the embodiments.
Figure 12C:
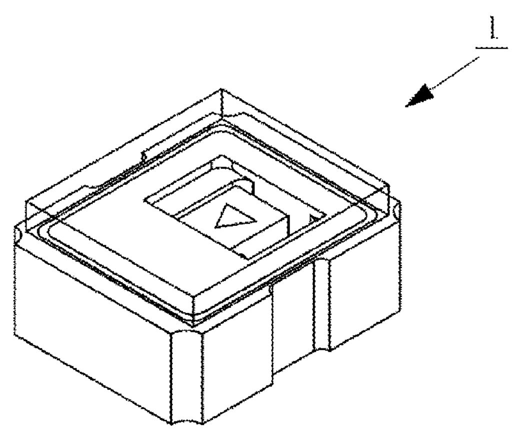
FIG. 12C is a perspective view, from above, of the light-emitting device including the wavelength conversion member of the tenth example according to the embodiments.
Figure 12D:
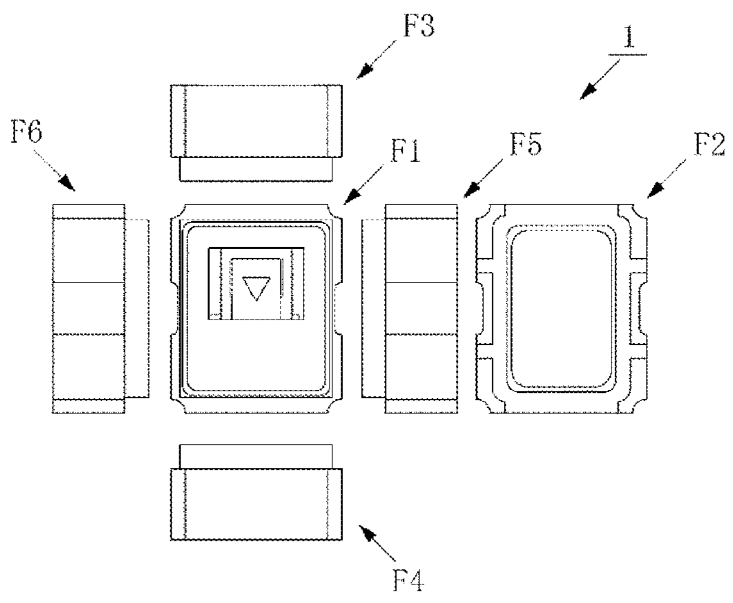
FIG. 12D illustrates six-face views of the light-emitting device including the wavelength conversion member of the tenth example according to the embodiments.
Figure 13A:
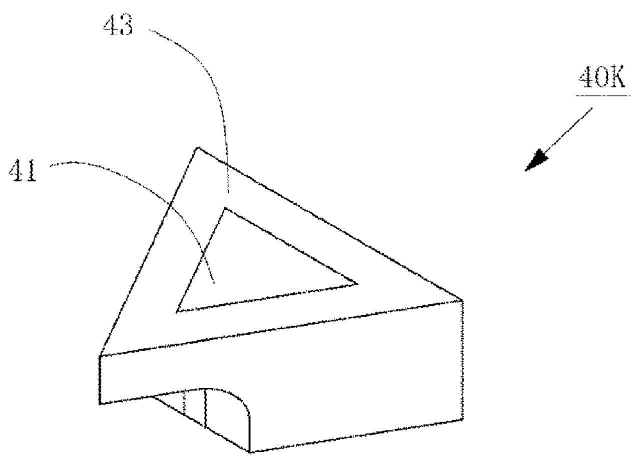
FIG. 13A is a perspective view, from above, of a wavelength conversion member of an eleventh example according to the embodiments.
Figure 13B:
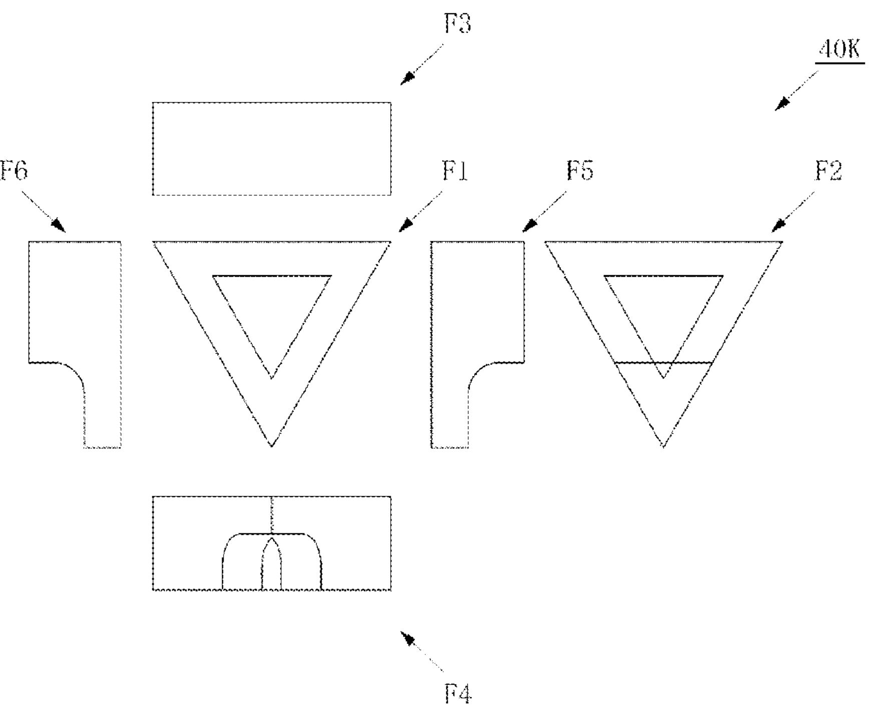
FIG. 13B illustrates six-face views of the wavelength conversion member of the eleventh example according to the embodiments.
Figure 13C:
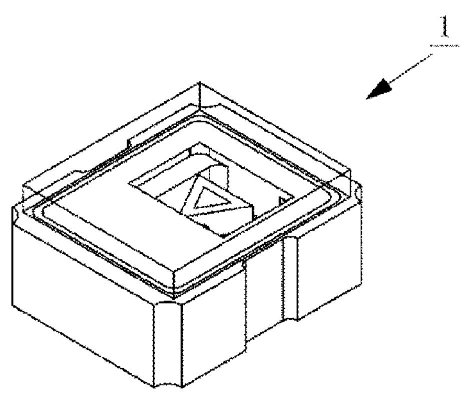
FIG. 13C is a perspective view, from above, of the light-emitting device including the wavelength conversion member of the eleventh example according to the embodiments.
Figure 13D:
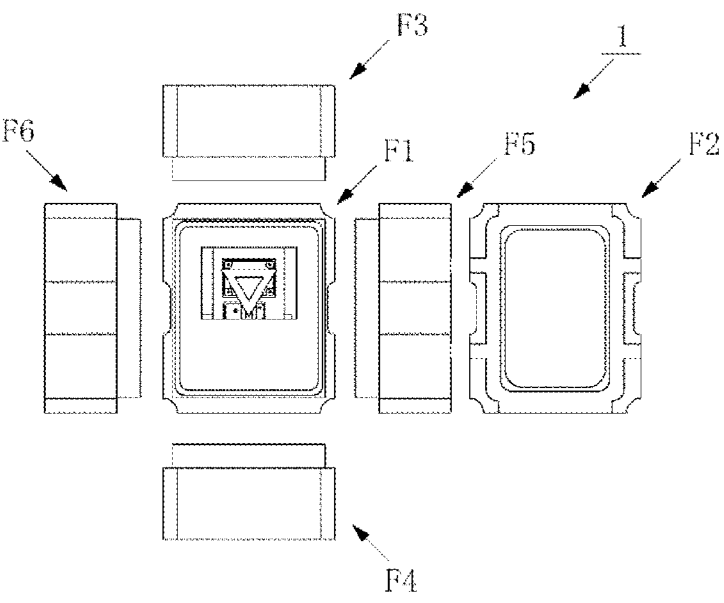
FIG. 13D illustrates six-face views of the light-emitting device including the wavelength conversion member of the eleventh example according to the embodiments.
Figure 14A:
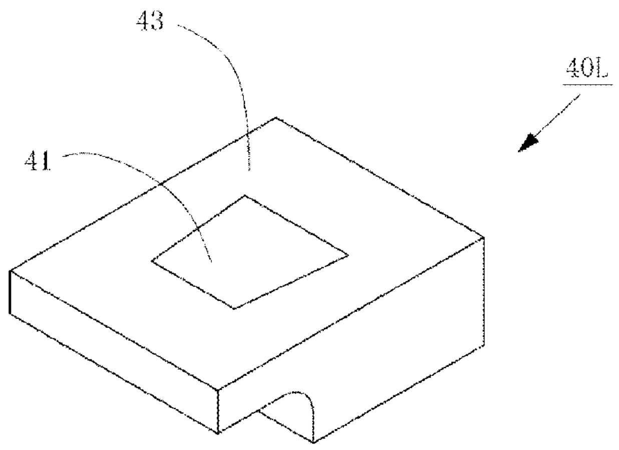
FIG. 14A is a perspective view, from above, of a wavelength conversion member of a twelfth example according to the embodiments.
Figure 14B:
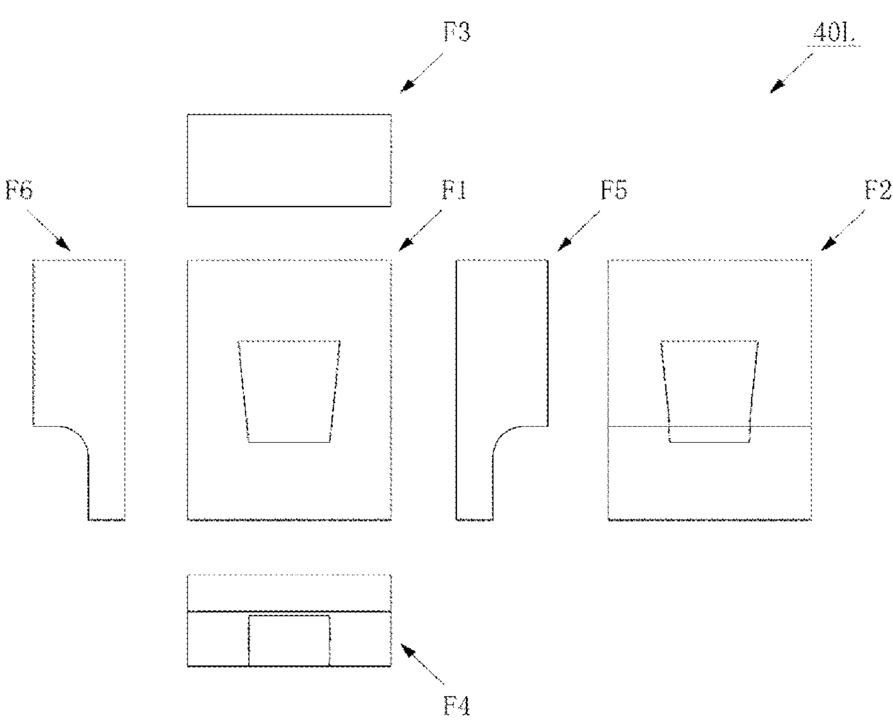
FIG. 14B illustrates six-face views of the wavelength conversion member of the twelfth example according to the embodiments.
Figure 14C:
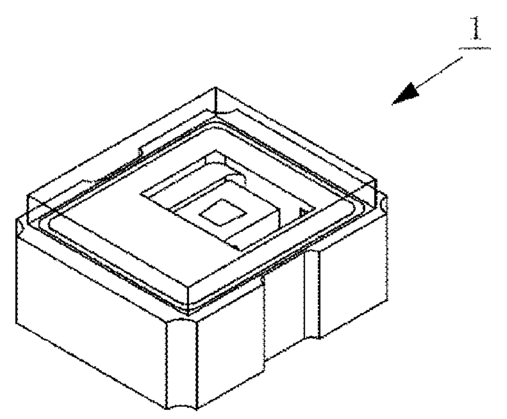
FIG. 14C is a perspective view, from above, of the light-emitting device including the wavelength conversion member of the twelfth example according to the embodiments.
Figure 14D:
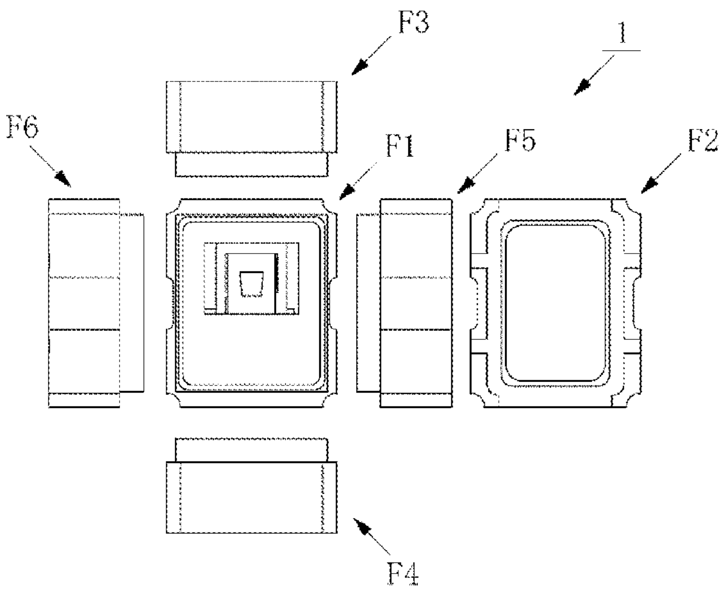
FIG. 14D illustrates six-face views of the light-emitting device including the wavelength conversion member of the twelfth example according to the embodiments.
Figure 15A:
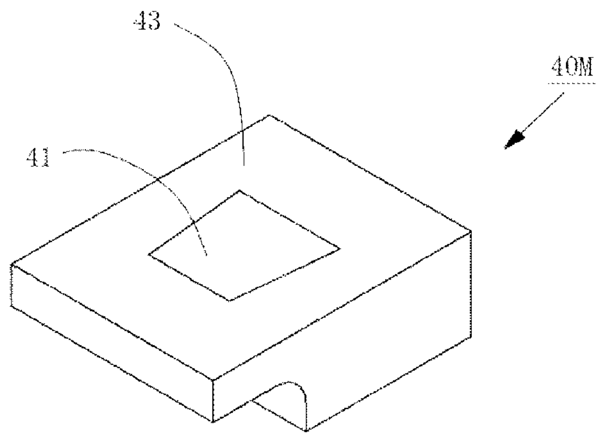
FIG. 15A is a perspective view, from above, of a wavelength conversion member of a thirteenth example according to the embodiments.
Figure 15B:
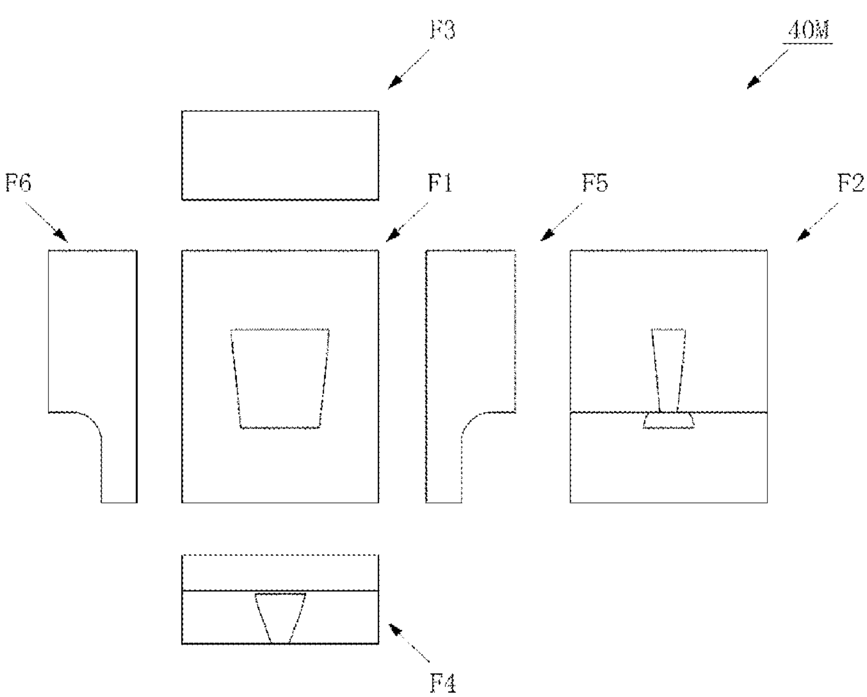
FIG. 15B illustrates six-face views of the wavelength conversion member of the thirteenth example according to the embodiments.
Figure 15C:
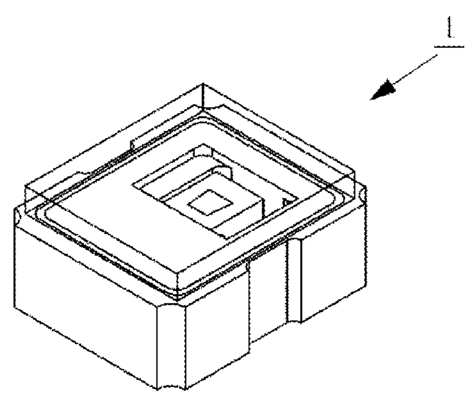
FIG. 15C is a perspective view, from above, of the light-emitting device including the wavelength conversion member of the thirteenth example according to the embodiments.
Figure 15D:
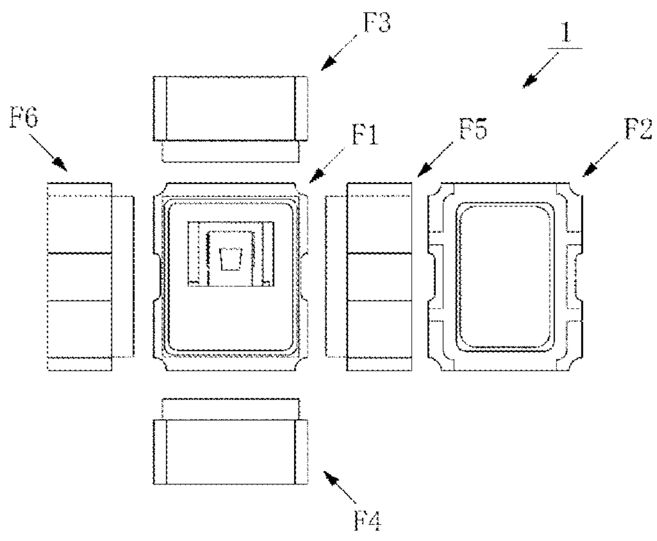
FIG. 15D illustrates six-face views of the light-emitting device including the wavelength conversion member of the thirteenth example according to the embodiments.
Figure 16A:
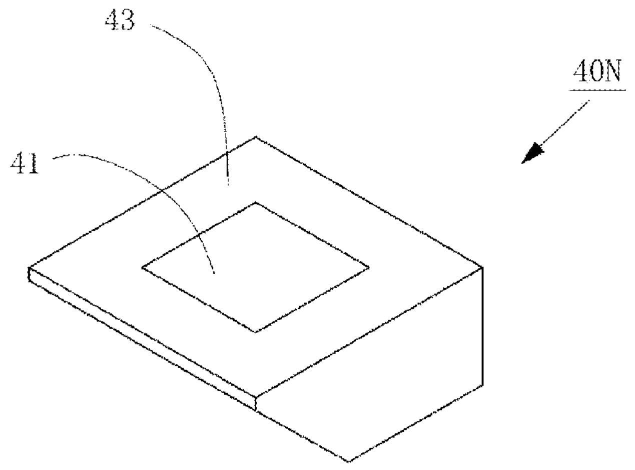
FIG. 16A is a perspective view, from above, of a wavelength conversion member of a fourteenth example according to a modified example.
Figure 16B:
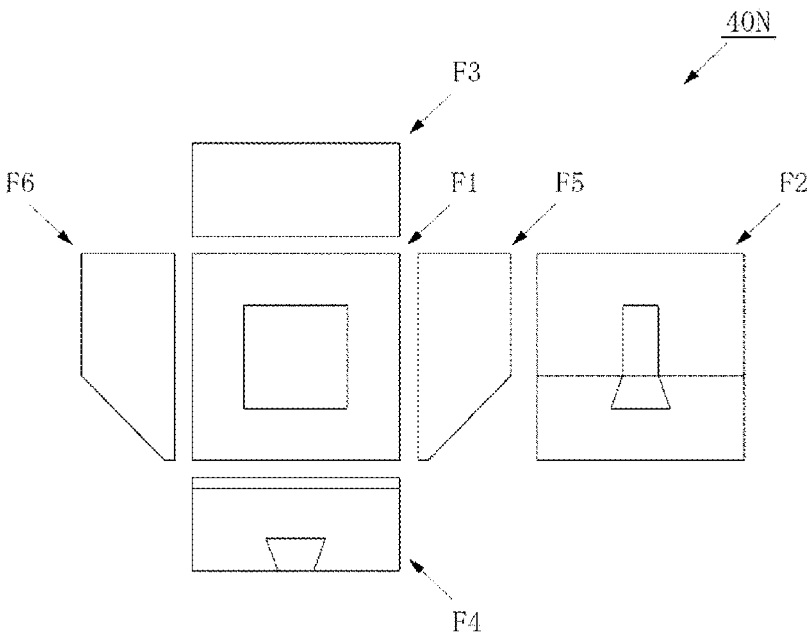
FIG. 16B illustrates six-face views of the wavelength conversion member of the fourteenth example according to the modified example.
Figure 16C:
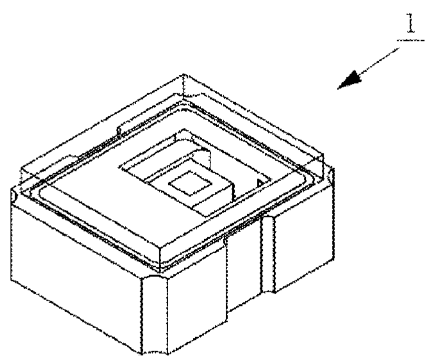
FIG. 16C is a perspective view, from above, of the light-emitting device including the wavelength conversion member of the fourteenth example according to the modified example.
Figure 16D:
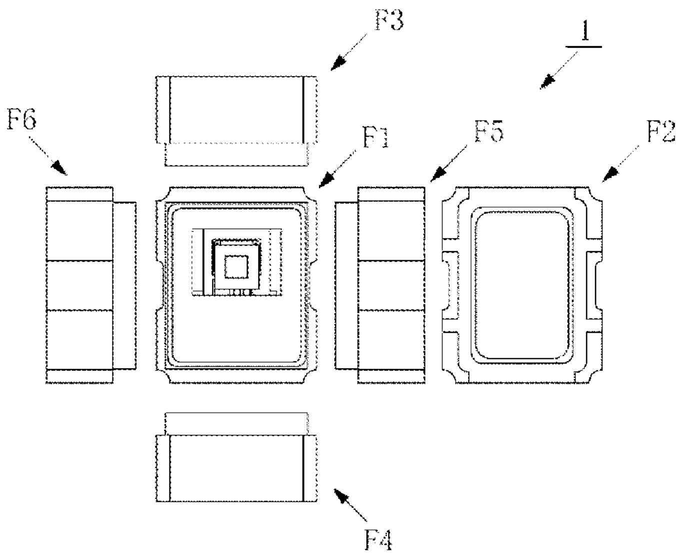
FIG. 16D illustrates six-face views of the light-emitting device including the wavelength conversion member of the fourteenth example according to the modified example.
Figure 17A:
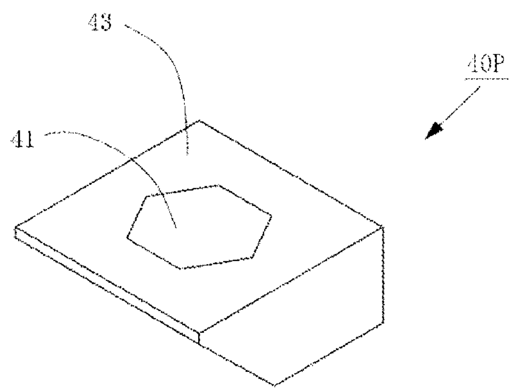
FIG. 17A is a perspective view, from above, of a wavelength conversion member of a fifteenth example according to a modified example.
Figure 17B:
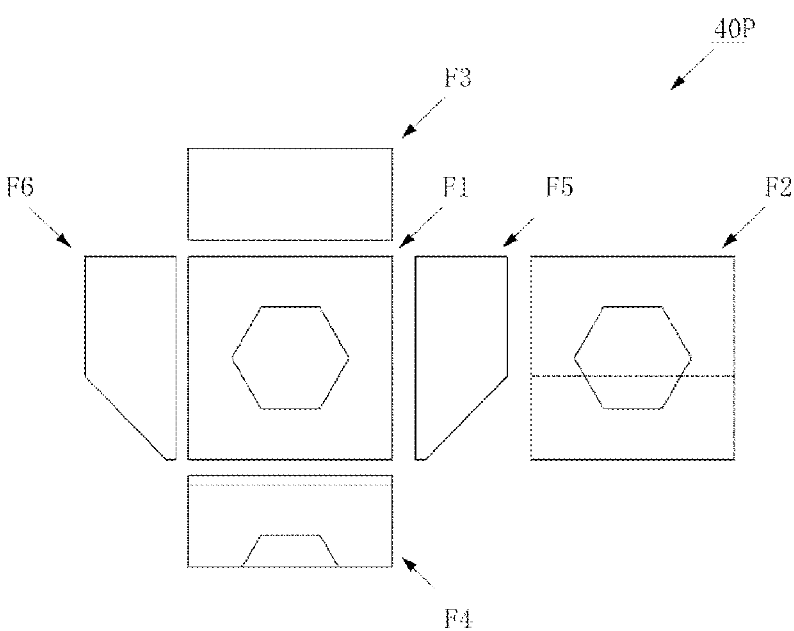
FIG. 17B illustrates six-face views of the wavelength conversion member of the fifteenth example according to the modified example.
Figure 17C:
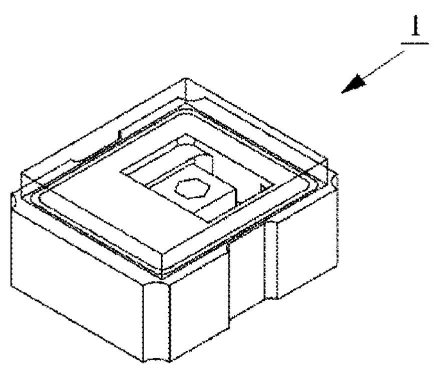
FIG. 17C is a perspective view, from above, of the light-emitting device including the wavelength conversion member of the fifteenth example according to the modified example.
Figure 17D:
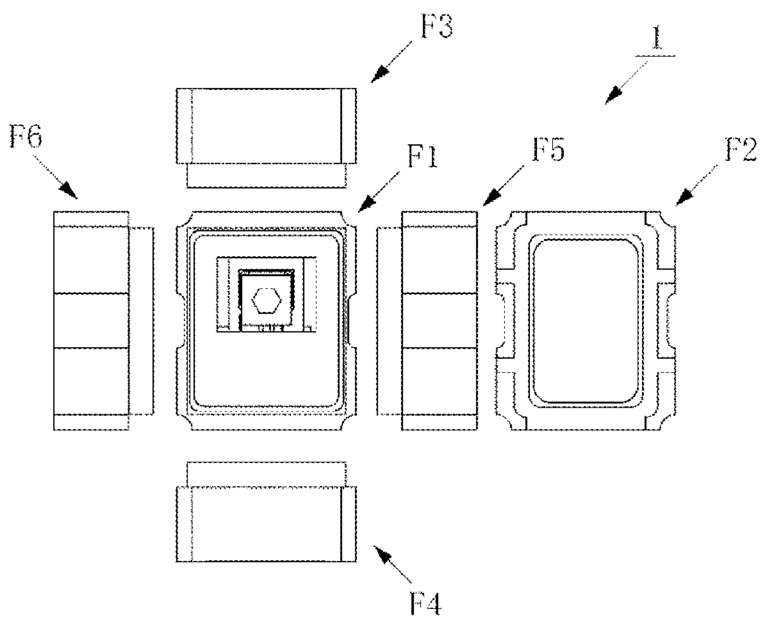
FIG. 17D illustrates six-face views of the light-emitting device including the wavelength conversion member of the fifteenth example according to the modified example.
Figure 18A:
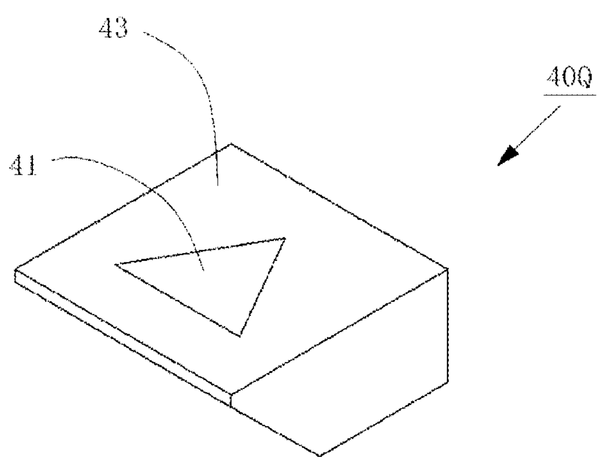
FIG. 18A is a perspective view, from above, of a wavelength conversion member of a sixteenth example according to a modified example.
Figure 18B:
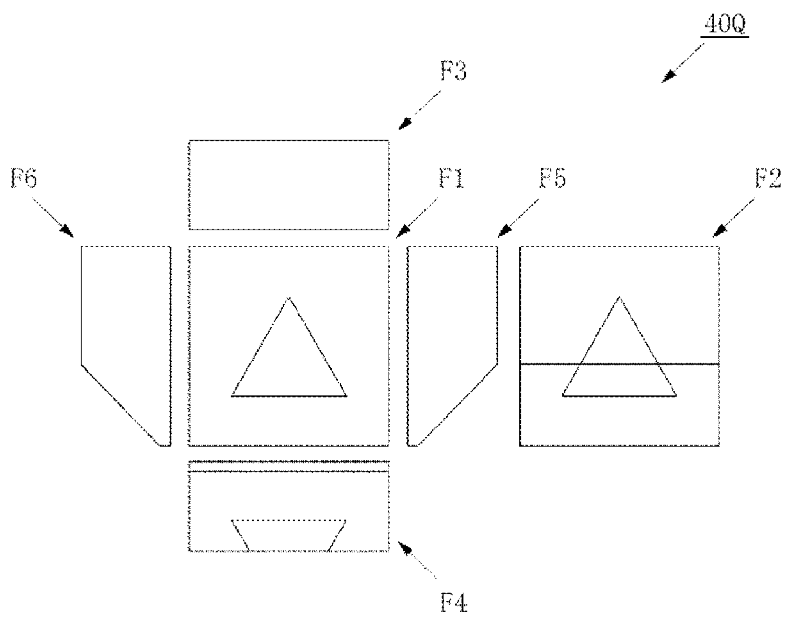
FIG. 18B illustrates six-face views of the wavelength conversion member of the sixteenth example according to the modified example.
Figure 18C:
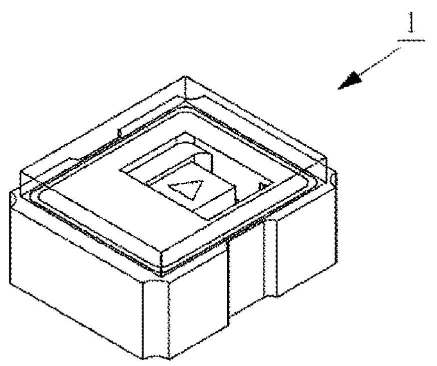
FIG. 18C is a perspective view, from above, of the light-emitting device including the wavelength conversion member of the sixteenth example according to the modified example.
Figure 18D:
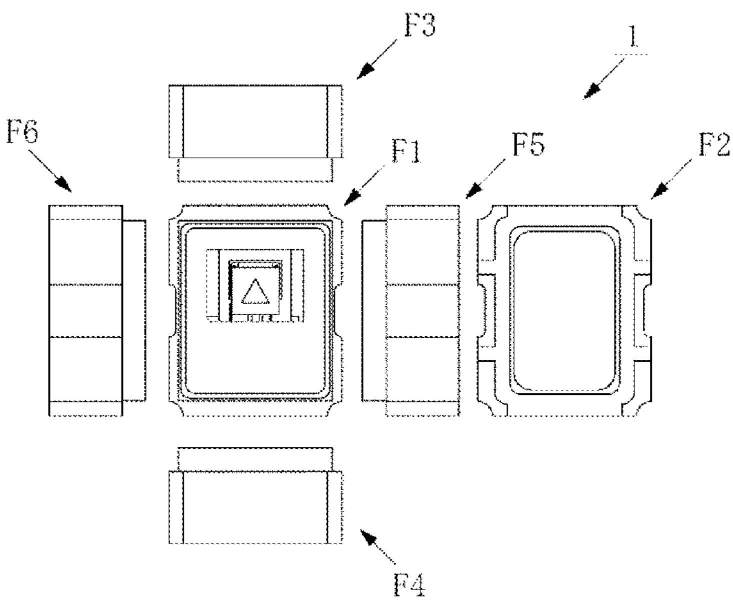
FIG. 18D illustrates six-face views of the light-emitting device including the wavelength conversion member of the sixteenth example according to the modified example.

Light-emitting devices 1 according to the embodiments will be described. FIG. 1 to FIG. 18D are drawings each depicting one exemplary form of the light-emitting devices 1. FIG. 1 is a perspective view of the light-emitting device 1. FIG. 2 is a cross-sectional view of FIG. 1 taken along cross-sectional line II-II. FIG. 3A to FIG. 3D are drawings depicting the light-emitting device 1 including a wavelength conversion member 40A, which is the first example of a wavelength conversion member 40. FIG. 4A to FIG. 4D are drawings depicting the light-emitting device 1 including a wavelength conversion member 40B, which is the second example of the wavelength conversion member 40. FIG. 5A to FIG. 5D are drawings depicting the light-emitting device 1 including a wavelength conversion member 40C, which is the third example of the wavelength conversion member 40. FIG. 6A to FIG. 6D are drawings depicting the light-emitting device 1 including a wavelength conversion member 40D, which is the fourth example of the wavelength conversion member 40. FIG. 7A to FIG. 7D are drawings depicting the light-emitting device 1 including a wavelength conversion member 40E, which is the fifth example of the wavelength conversion member 40. FIG. 8A to FIG. 8D are drawings depicting the light-emitting device 1 including a wavelength conversion member 40F, which is the sixth example of the wavelength conversion member 40. FIG. 9A to FIG. 9D are drawings depicting the light-emitting device 1 including a wavelength conversion member 40G, which is the seventh example of the wavelength conversion member 40. FIG. 10A to FIG. 10D are drawings depicting the light-emitting device 1 including a wavelength conversion member 40H, which is the eighth example of the wavelength conversion member 40. FIG. 11A to FIG. 11D are drawings depicting the light-emitting device 1 including a wavelength conversion member 40I, which is the ninth example of the wavelength conversion member 40. FIG. 12A to FIG. 12D are drawings depicting the light-emitting device 1 including a wavelength conversion member 40J, which is the tenth example of the wavelength conversion member 40. FIG. 13A to FIG. 13D are drawings depicting the light-emitting device 1 including a wavelength conversion member 40K, which is the eleventh example of the wavelength conversion member 40. FIG. 14A to FIG. 14D are drawings depicting the light-emitting device 1 including a wavelength conversion member 40L, which is the twelfth example of the wavelength conversion member 40. FIG. 15A to FIG. 15D are drawings depicting the light-emitting device 1 including a wavelength conversion member 40M, which is the thirteenth example of the wavelength conversion member 40. FIG. 16A to FIG. 16D are drawings depicting the light-emitting device 1 of the modified example including a wavelength conversion member 40N, which is the fourteenth example of the wavelength conversion member 40. FIG. 17A to FIG. 17D are drawings depicting the light-emitting device 1 of the modified example including a wavelength conversion member 40P, which is the fifteenth example of the wavelength conversion member 40. FIG. 18A to FIG. 18D are drawings depicting the light-emitting device 1 of the modified example including a wavelength conversion member 40Q, which is the sixteenth example of the wavelength conversion member 40. Note that, except for FIG. 1, the light-emitting device 1 is illustrated in a state of being seeable through the surface of a cover portion 17 including a light transmissive portion and a light-shielding film. Also, the six-face views are not the same as the actual sizes, and are illustrated without emphasizing differences in size and positional relationships between the members. Also, the six-face views are a front view indicated by arrow F1, a rear view indicated by arrow F2, a plan view indicated by arrow F3, a bottom view indicated by arrow F4, a right-hand side view indicated by arrow F5, and a left-hand side view indicated by arrow F6.

The light-emitting device 1 includes a plurality of components. The plurality of components includes a package 10, a semiconductor laser element 20, a submount 30, and the wavelength conversion member 40. Note that the light-emitting device 1 may further include other components. Also, the light-emitting device 1 may not include some of the plurality of components described above.

First, each of the components will be described.

(Package 10)

The package 10 includes a base portion 14, a frame portion 15, and the cover portion 17. The package 10 includes, for example, a base member constituting the base portion 14 and the frame portion 15, and a cover member constituting the cover portion 17. Note that the base member may be formed by bonding a mounted member constituting the base portion 14 to a frame member constituting the frame portion 15. Alternatively, the package 10 may include a base member constituting the base portion 14, and a cover member constituting the frame portion 15 and the cover portion 17.

The package 10 includes a closed space in the interior thereof. This inner space (closed space formed in the interior) is a sealed space. Also, this inner space is a space that is hermetically sealed in a predetermined atmosphere.

The package 10 includes disposition regions where other components are disposed. The disposition regions are provided on the upper surface of the package 10. Although the disposition regions are not necessarily provided on the same plane, the disposition regions are provided on planes facing toward the same direction (here, on planes facing upward).

A main material of the mounted member is, for example, a metal or a metal-containing composite. For example, the main material of the mounted member is copper. Also, a main material of the frame member is, for example, a ceramic. For example, the main material of the frame member is aluminum nitride, silicon nitride, or aluminum oxide. Also, a main material of the cover member is, for example, quartz, silicon carbide, sapphire, or glass. Note that, when the base portion 14 and the frame portion 15 are integrally formed using the same material, the main material of the base member is a ceramic.

As used herein, the main material refers to a material that has the highest weight or volume percentage in a formed product of interest. Note that, when the formed product of interest is formed from one material, that material is the main material. That is, the fact that a certain material is the main material includes a case in which the percentage of that material can be 100%.

(Semiconductor Laser Element 20)

The semiconductor laser element 20 has emission end surfaces that emit light. The semiconductor laser element 20 has an upper surface, a lower surface, and a plurality of lateral surfaces. The lateral surfaces of the semiconductor laser element 20 become the emission end surfaces. The outer shape of the semiconductor laser element 20 in a top view is a rectangular shape having long sides and short sides. This outer shape is not necessarily such a rectangular shape.

The semiconductor laser element 20 to be used can be, for example, a semiconductor laser element that emits blue light. As used herein, the blue light refers to light having a light emission peak within the range of 420 nm to 494 nm. Note that the semiconductor laser element 20 to be used may be a semiconductor laser element that emits light of another color. The semiconductor laser element 20 to be used may be a semiconductor laser that emits light having a light emission peak within the range of 320 nm to 530 nm.

The semiconductor laser element 20 is, for example, a semiconductor laser element containing a nitride semiconductor. As the nitride semiconductor, for example, GaN, InGaN, and AlGaN can be used.

Here, the light emitted from the semiconductor laser element will be described. The light emitted from the semiconductor laser element (laser beam) exhibits divergence. The light emitted from the semiconductor laser element forms an elliptic far-field pattern (hereinafter referred to as "FFP") in a plane parallel to the emission end surface of the light. The FFP indicates the shape or light intensity distribution of emitted light at a position away from the emission end surface.

Here, light passing through the center of the elliptic shape of the FFP, in other words, light having a peak intensity in the light intensity distribution of the FFP, is referred to as light traveling along an optical axis or light lying along an optical axis. Also, light having an intensity of $1/e^2$ or more of the peak intensity in the light intensity distribution of the FFP is referred to as a main portion of the light.

The shape of the FFP of the light emitted from the semiconductor laser element is an elliptic shape that is longer in a stacking direction than in a direction perpendicular to the stacking direction in the plane parallel to the emission end surface of the light. The stacking direction refers to a direction in which a plurality of semiconductor layers including an active layer are stacked in the semiconductor laser element. The direction perpendicular to the stacking direction can also be referred to as a plane direction of the semiconductor layers. Further, a direction along the major axis of the elliptic shape of the FFP can also be referred to as a fast axis direction of the semiconductor laser element, and a direction along the minor axis of the elliptic shape of the FFP can also be referred to as a slow axis direction of the semiconductor laser element.

On the basis of the light intensity distribution of the FFP, an angle at which light having a light intensity of $1/e^2$ of the peak light intensity diverges is referred to as an angle of divergence of the light of the semiconductor laser element. The angle of divergence may be determined from, for example, a light intensity half the peak light intensity, as well as from the light intensity of $1/e^2$ of the peak light intensity. In the description of the present specification, the term "angle of divergence" refers to the angle of divergence of the light at a light intensity of $1/e^2$ of the peak light intensity. Note that the angle of divergence in the fast axis direction is larger than the angle of divergence in the slow axis direction.

As the semiconductor laser element 20, for example, it is possible to use a semiconductor laser element having an angle of divergence in the slow axis direction of 2 degrees to 30 degrees. As the semiconductor laser element 20, for example, it is possible to use a semiconductor laser element having an angle of divergence in the fast axis direction of 5 degrees to 120 degrees.

(Submount 30)

The submount 30 has an upper surface and a lower surface. The submount 30 is formed in a rectangular parallelepiped shape. The submount 30 has, in a top view, a rectangular outer shape having long sides and short sides. The width of the submount 30 is the smallest in the up-and-down direction. The width of the submount 30 in the up-and-down direction can be 50 μm or more and 1000 μm or less. Note that the shape of the submount 30 is not limited to a rectangular parallelepiped shape. The submount 30 can be formed using, for example, silicon nitride, aluminum nitride, or silicon carbide.

(Wavelength Conversion Member 40)

The wavelength conversion member 40 includes a wavelength conversion portion 41 and a reflective portion 43. In the wavelength conversion member 40, the surface of a part of the wavelength conversion portion 41 is covered with the reflective portion 43, and the surface of the other part thereof is not covered with the reflective portion 43.

The wavelength conversion portion 41 has an upper surface 42A, a lower surface 42B, and one or more lateral surfaces 42. In the wavelength conversion member 40, the upper surface 42A of the wavelength conversion portion 41 is not covered with the reflective portion 43. In the wavelength conversion member 40, a part of the one or more lateral surfaces 42 is covered with the reflective portion 43, and the other part thereof is not covered with the reflective portion 43. The part of the one or more lateral surfaces 42 covered with the reflective portion 43 contacts the reflective portion 43.

The wavelength conversion portion 41 includes a light incident surface and a light-emitting surface. In the wavelength conversion portion 41, a region of the one or more lateral surfaces 42 that is not covered with the reflective portion 43 can be the light incident surface. In the wavelength conversion portion 41, a region of the upper surface 42A that is not covered with the reflective portion 43 can be the light-emitting surface. The reflective portion 43 is provided on a surface of the wavelength conversion portion 41 that does not include the light incident surface and the light-emitting surface.

For example, the one lateral surface 42 not covered with the reflective portion 43 in the entirety thereof can be the light incident surface. Also, for example, an uncovered region of the one lateral surface 42 that is partially covered with the reflective portion 43 can be the light incident surface. Also, for example, one region that is formed by selectively combining these lateral surfaces 42 and is not covered with the reflective portion 43 can be the light incident surface.

The lower surface 42B of the wavelength conversion portion 41 is not covered with the reflective portion 43. Note that the lower surface 42B may be covered with the reflective portion 43.

In the wavelength conversion portion 41, a region of the one or more lateral surfaces 42 that is located opposite to the light incident surface is covered with the reflective portion 43. In the wavelength conversion portion 41, a region of the one or more lateral surfaces 42 that is continuous from the light incident surface is covered with the reflective portion 43. In the wavelength conversion portion 41, all of the one or more lateral surfaces 42 that intersect the light incident surface are covered with the reflective portion 43. In the wavelength conversion portion 41, the entire region of the one or more lateral surfaces 42 that is other than the light incident surface is covered with the reflective portion 43.

On the surface of the wavelength conversion member 40, the light incident surface and the light-emitting surface do not connect to each other. In other words, the wavelength conversion portion 41 can be formed of one single member, but on the surface of the wavelength conversion member 40, the light incident surface and the light-emitting surface are not directly connected. On the surface of the wavelength conversion member 40, the reflective portion 43 separates the light incident surface and the light-emitting surface from each other.

In a plan view perpendicular to the light-emitting surface of the wavelength conversion portion 41, the reflective portion 43 surrounds the entire periphery of the light-emitting surface. In a plan view perpendicular to the light incident surface of the wavelength conversion portion 41, the upper end of the light incident surface is located below the upper surface 42A.

The reflective portion 43 has a lateral surface that is flush with the light incident surface of the wavelength conversion portion 41 and extends at least laterally. Also, this lateral surface is flush with the light incident surface of the wavelength conversion portion 41 and can extend upward of the light incident surface. Note that, as used herein, the term "laterally" means the same direction as the Y direction in the light-emitting device 1 as illustrated. The reflective portion 43 includes a projecting portion that projects laterally of the light incident surface. The projecting portion is formed above the light incident surface. The projecting portion is formed between the upper end of the light incident surface and the upper end of the light-emitting surface. Further, a part of the projecting portion can be formed below the upper end of the light incident surface or above the upper end of the light-emitting surface.

The light-emitting surface and the light incident surface of the wavelength conversion portion 41 satisfy a relationship that there is an imaginary line that runs in an inner region of the outer edge of the light-emitting surface (the inner region excluding the outer edge), is perpendicular to the light-emitting surface, and penetrates the light incident surface.

The wavelength conversion portion 41 contains a phosphor. Examples of the phosphor include cerium-activated yttrium-aluminum-garnet (YAG), cerium-activated lutetium-aluminum-garnet (LAG), europium-activated silicate ($(Sr,Ba)_2SiO_4$), α-SiAlON phosphors, and β-SiAlON phosphors. Among these phosphors, YAG phosphors have good heat resistance.

The wavelength conversion portion 41 is preferably formed using, as the main material, an inorganic material that is readily decomposed by irradiation with light. The main material of the wavelength conversion portion 41 is, for example, a ceramic. Note that the main material is not limited to the ceramic. Also, the wavelength conversion portion 41 may be formed of a single crystal of the phosphor. Examples of the ceramic include aluminum oxide, aluminum nitride, silicon oxide, yttrium oxide, zirconium oxide, and magnesium oxide.

The wavelength conversion portion 41 is formed using, for example, a ceramic as the main material. Also, for example, the wavelength conversion portion 41 is a sintered body. The wavelength conversion portion 41 can be formed by sintering, for example, a phosphor and a light-transmissive material such as aluminum oxide. Also, for example, it may be possible to use a ceramic that is formed by sintering powder of a phosphor and substantially consists of the phosphor.

The main material of the reflective portion 43 is, for example, a ceramic. Examples of the ceramic to be used as the main material include aluminum oxide, aluminum nitride, silicon oxide, yttrium oxide, zirconium oxide, and magnesium oxide. The reflective portion 43 is formed using, for example, a ceramic as the main material. Also, for example, the reflective portion 43 is a sintered body.

The wavelength conversion member 40 can be formed by, for example, integrally sintering the wavelength conversion portion 41 and the reflective portion 43. Note that the main material of the reflective portion 43 is not necessarily a ceramic. For example, the reflective portion 43 can be constituted of a metal film containing a metal as the main material, or a dielectric multilayer film formed by stacking dielectric layers to form a multilayer. Examples of the metal to be used as the main material include silver and aluminum. Also, the dielectric layers can be formed using, for example, silicon oxide, niobium oxide, aluminum oxide, aluminum nitride, titanium oxide, or tantalum oxide.

Next, the light-emitting device 1 including the above-described components will be described.

(Light-Emitting Device 1)

In the light-emitting device 1, the semiconductor laser element 20 is disposed in the inner space of the package 10. The semiconductor laser element 20 is disposed in the base portion 14 of the package 10. The semiconductor laser element 20 is disposed in the disposition region of the package 10.

The semiconductor laser element 20 emits laterally traveling light from the emission end surface. The semiconductor laser element 20 emits light traveling in the first direction from the emission end surface. The light that is emitted from the semiconductor laser element 20 and travels along the optical axis can be the light traveling in the first direction. In the light-emitting device as illustrated, the first direction is the same direction as the positive X-direction.

The semiconductor laser element 20 is mounted in the package 10 via the submount 30. The submount 30 is bonded to the upper surface (disposition region) of the package 10, and the semiconductor laser element 20 is disposed on the submount 30. By including the submount 30, a light-emission point of the semiconductor laser element 20 can be made high.

In the light-emitting device 1, the wavelength conversion member 40 is disposed in the inner space of the package 10. The wavelength conversion member 40 is disposed in the disposition region of the package 10. The wavelength conversion member 40 is disposed at a position away in the first direction from a position at which the semiconductor laser element 20 is disposed. The wavelength conversion member 40 is disposed such that the light incident surface is oriented to face the emission end surface of the semiconductor laser element 20. Note that, in a top view, a projecting portion of the wavelength conversion member 40 can partially overlap the semiconductor laser element 20.

In a plan view perpendicular to the light-emitting surface of the wavelength conversion portion 41, a region of at least 80% or more of the light incident surface of the wavelength conversion portion 41 is included in a region away in the first direction from an imaginary line that passes through the point of the light-emitting surface closest to the semiconductor laser element 20 and is parallel to the second direction. Note that the second direction is a perpendicular direction to the first direction in the plan view perpendicular to the light-emitting surface of the wavelength conversion portion 41. In the light-emitting device as illustrated, the second direction is the same direction as the Y direction.

The semiconductor laser element 20 emits light traveling from the emission end surface toward the wavelength conversion member 40. The light emitted from the semiconductor laser element 20 is incident on the light incident surface. In the light incident surface, a main portion of the light emitted from the semiconductor laser element 20 is included in the outer edge of the light incident surface. The wavelength conversion portion 41 emits light converted in wavelength based on the light emitted from the semiconductor laser element 20. The wavelength conversion portion 41 emits the light converted in wavelength from the light-emitting surface.

The light incident surface of the wavelength conversion member 40 has such a shape that the maximum width thereof in a third direction is larger than the maximum width thereof in the second direction. On a plane perpendicular to the first direction, the main portion of the light emitted from the semiconductor laser element 20 preferably has such a shape that is longer in the third direction than in the second direction. Note that the second direction and the third direction are orthogonal to each other. In the light-emitting device as illustrated, the third direction is the same direction as the Z direction. For example, the fast axis direction of the FFP of the light emitted from the semiconductor laser element 20 is set to the same direction as the third direction, and the slow axis direction thereof is set to the same direction as the second direction. Thereby, it is possible to suppress emission of the light from the light incident surface of the wavelength conversion portion 41, and efficiently output light from the light-emitting surface of the wavelength conversion member 40.

Note that the light incident surface of the wavelength conversion member 40 may have such a shape that the maximum width thereof in the third direction is smaller than the maximum width thereof in the second direction. Adjustment of such a shape is possible by, for example, adjusting the length of the wavelength conversion member 40 in the third direction or adjusting the size of the light-emitting surface. In this case, on a plane perpendicular to the first direction, the main portion of the light emitted from the semiconductor laser element 20 preferably has a shape that is longer in the second direction than in the third direction. For example, the fast axis direction of the FFP of the light emitted from the semiconductor laser element 20 is set to the same direction as the second direction, and the slow axis direction thereof is set to the same direction as the third direction. Thereby, it is possible to suppress emission of the light from the light incident surface of the wavelength conversion portion 41, and efficiently output light from the light-emitting surface of the wavelength conversion member 40.

From the light-emitting surface of the wavelength conversion member 40, the light from the semiconductor laser element 20 or the light converted in wavelength by the wavelength conversion portion 41 is emitted. Although it is possible to emit only the light converted in wavelength from the light-emitting surface, for example, it is also possible to emit white light by emitting the blue light emitted from the semiconductor laser element 20 in combination with yellow fluorescent light emitted from the phosphor contained in the wavelength conversion portion 41.

The light emitted from the light-emitting surface of the wavelength conversion member 40 passes through the package 10, and is emitted to the exterior of the package 10. The light emitted from the light-emitting surface of the wavelength conversion member 40 passes through the cover portion 17 of the package 10, and is emitted upward. In this way, when the wavelength conversion member having the light incident surface at the lateral surface thereof and the light-emitting surface at the upper surface thereof is used, the number of parts can be reduced as compared with a configuration including a mirror and a wavelength conversion member. Also, the production process thereof can be simplified as compared with a production process including mounting the mirror in a package and mounting the wavelength conversion member on the package. Also, the light-emitting device can be produced at a lower cost.

Also, because the semiconductor laser element 20 emits light laterally, it is possible to produce the light-emitting device having a structure in which the laser beam from the semiconductor laser element 20 is not directly emitted from the cover portion 17 of the package 10. Therefore, safety of the light-emitting device utilizing the laser beam can be enhanced.

The reflective portion 43 reflects: the light emitted from the semiconductor laser element 20 and incident on the wavelength conversion portion 41; and the light converted in wavelength by the wavelength conversion portion 41. In a region of the wavelength conversion portion 41 that is covered with the reflective portion 43, the light incident on the reflective portion 43 from the wavelength conversion portion 41 is reflected by the reflective portion 43 and returned back to the wavelength conversion portion 41. This suppresses emission of the light from the region other than the light incident surface or the light-emitting surface, and efficiently outputs the light from the light-emitting surface.

In the light-emitting device 1, in a direction perpendicular to the lower surface of the package 10, the length from the upper surface of the semiconductor laser element 20 to the lower surface of the cover portion 17 of the package 10 is smaller than the width of the wavelength conversion member 40. By satisfying such a condition, even if the wavelength conversion member 40 mounted in the package 10 becomes detached from the package 10, it is possible to restrict a movable range of the wavelength conversion member 40, and contribute to increase in safety of the light-emitting device 1.

The package 10 includes a light-shielding portion configured to shield light having the same wavelength range as the wavelength range of the light emitted from the semiconductor laser element 20. Also, the package 10 includes a light transmissive portion configured to transmit therethrough the light emitted from the light-emitting surface of the wavelength conversion member 40 and emit the light to the exterior. For example, the light-shielding portion is provided at the frame portion 15 of the package 10. Also, for example, the light transmissive portion is provided at the cover portion 17 of the package 10.

In the light-emitting device 1, the light-shielding portion is not necessarily disposed on an extension of an optical path through which the main portion of the light emitted from the emission end surface of the semiconductor laser element 20 is emitted from the emission end surface toward the uppermost point and incident on the wavelength conversion member 40.

In the light-emitting device 1, the light transmissive portion may be disposed on an extension of an optical path through which the main portion of the light is emitted from the emission end surface of the semiconductor laser element 20 toward the uppermost point and incident on the wavelength conversion member 40, and on a line segment before intersection between the extension and the light-shielding portion.

In the light-emitting device 1, the cover portion 17 of the package 10 is provided, at the upper or lower surface of the cover portion 17, with the light-shielding film surrounding the light transmissive portion. The light-shielding film is provided, at the upper or lower surface of the cover portion 17, over the entire region excluding the light transmissive portion. Thereby, it is possible to emit light from a desired region of the package 10, and suppress emission of light from the other region. Note that, in the light-emitting device 1 as illustrated, the light-shielding film is provided on the lower surface of the cover portion 17.

In the light-emitting device 1, in a top view, the light-emitting surface of the wavelength conversion portion 41 does not overlap the light-shielding film of the cover portion 17. In the light-emitting device 1, in a top view, the upper surface of the reflective portion 43 partially overlaps the light-shielding film of the cover portion 17. In the light-emitting device 1, in a top view, the outer edge of the wavelength conversion member 40 partially overlaps the light-shielding film of the cover portion 17. Note that, in the light-emitting device 1, in a top view, the outer edge of the wavelength conversion member 40 may entirely overlap the light-shielding film of the cover portion 17. Alternatively, in the light-emitting device 1, in a top view, the outer edge of the wavelength conversion member 40 does not necessarily entirely overlap the light-shielding film of the cover portion 17.

Here, as examples of the wavelength conversion member 40 included in the light-emitting device 1, a wavelength conversion member 40A to a wavelength conversion member 40Q will be described. Also, the light-emitting device 1 including the wavelength conversion member 40 of each of the examples will be described.

(Light-Emitting Device 1 Including Wavelength Conversion Member 40A)

FIG. 3A to FIG. 3D are drawings in relation to the wavelength conversion member 40A. In a plan view perpendicular to the light-emitting surface, the light-emitting surface of the wavelength conversion portion 41 has a shape having a first region decreasing in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a triangular shape. Note that, in the wavelength conversion member 40A as illustrated, the first direction is the same direction as the positive X-direction.

The maximum width in the second direction of the light incident surface of the wavelength conversion portion 41 is larger than the minimum width in the second direction in the first region of the light-emitting surface of the wavelength conversion portion 41.

The maximum width in the second direction of the light incident surface of the wavelength conversion portion 41 is the same as the maximum width in the second direction in the first region of the light-emitting surface of the wavelength conversion portion 41.

At a position that passes through a point at which the light lying along the optical axis from the semiconductor laser element 20 is incident on the light incident surface of the wavelength conversion portion 41, the maximum width in the second direction of the light incident surface of the wavelength conversion portion 41 is smaller than the maximum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and subjecting the polygonal columnar wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40B)

FIG. 4A to FIG. 4D are drawings in relation to the wavelength conversion member 40B. In a plan view perpendicular to the light-emitting surface, the light-emitting surface of the wavelength conversion portion 41 has a shape having a first region decreasing in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a quadrangular shape. Note that, in the wavelength conversion member 40B as illustrated, the first direction is the same direction as the positive X-direction.

The maximum width in the second direction of the light incident surface of the wavelength conversion portion 41 is the same as the minimum width in the second direction in the first region of the light-emitting surface of the wavelength conversion portion 41.

The maximum width in the second direction of the light incident surface of the wavelength conversion portion 41 is smaller than the maximum width in the second direction in the first region of the light-emitting surface of the wavelength conversion portion 41.

At a position that passes through a point at which the light lying along the optical axis from the semiconductor laser element 20 is incident on the light incident surface of the wavelength conversion portion 41, the width in the second direction of the light incident surface of the wavelength conversion portion 41 is smaller than the minimum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example: using a frustum-shaped wavelength conversion portion having an upper surface and a lower surface each having the same shape as the light-emitting surface, the lower surface being smaller than the upper surface; and subjecting the frustum-shaped wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region being constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40C)

FIG. 5A to FIG. 5D are drawings in relation to the wavelength conversion member 40C. In a plan view perpendicular to the light-emitting surface, the light-emitting surface of the wavelength conversion portion 41 has a shape having a first region decreasing in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a quadrangular shape.

The maximum width in the second direction of the light incident surface of the wavelength conversion portion 41 is smaller than the minimum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example: using a frustum-shaped wavelength conversion portion having an upper surface and a lower surface each having the same shape as the light-emitting surface, the lower surface being smaller than the upper surface; and subjecting the frustum-shaped wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40D)

FIG. 6A to FIG. 6D are drawings in relation to the wavelength conversion member 40D. In a plan view perpendicular to the light-emitting surface, the light-emitting surface of the wavelength conversion portion 41 has a shape having a first region that is constant in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a quadrangular shape. Note that, in the wavelength conversion member 40D as illustrated, the first direction is the same direction as the positive X-direction.

The maximum width in the second direction of the light incident surface of the wavelength conversion portion 41 is larger than the minimum width in the second direction in the first region of the light-emitting surface of the wavelength conversion portion 41.

The maximum width in the second direction of the light incident surface of the wavelength conversion portion 41 is larger than the maximum width in the second direction in the first region of the light-emitting surface of the wavelength conversion portion 41.

The minimum width in the second direction of the light incident surface of the wavelength conversion portion 41 is larger than the minimum width in the second direction in the first region of the light-emitting surface of the wavelength conversion portion 41.

The minimum width in the second direction of the light incident surface of the wavelength conversion portion 41 is larger than the maximum width in the second direction in the first region of the light-emitting surface of the wavelength conversion portion 41.

In a plan view perpendicular to the light-emitting surface of the wavelength conversion portion 41, a region of at least 60% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 60% or more of the light incident surface of the wavelength conversion portion 41 is included in an inner region of the first region (the inner region excluding the outer edge of the first region). Such a shape can be simply produced because the shape can be formed by, for example: using a frustum-shaped wavelength conversion portion having an upper surface and a lower surface each having the same shape as the light-emitting surface, the lower surface being larger than the upper surface; and subjecting the frustum-shaped wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40E)

FIG. 7A to FIG. 7D are drawings in relation to the wavelength conversion member 40E. In a plan view perpendicular to the light-emitting surface, the light-emitting surface of the wavelength conversion portion 41 has a shape having a first region that is constant in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a quadrangular shape. Note that, in the wavelength conversion member 40E as illustrated, the first direction is the same direction as the positive X-direction.

The maximum width in the second direction of the light incident surface of the wavelength conversion portion 41 is the same as the minimum width in the second direction in the first region of the light-emitting surface of the wavelength conversion portion 41.

The maximum width in the second direction of the light incident surface of the wavelength conversion portion 41 is the same as the maximum width in the second direction in the first region of the light-emitting surface of the wavelength conversion portion 41.

The minimum width in the second direction of the light incident surface of the wavelength conversion portion 41 is the same as the minimum width in the second direction in the first region of the light-emitting surface of the wavelength conversion portion 41.

The minimum width in the second direction of the light incident surface of the wavelength conversion portion 41 is the same as the maximum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and subjecting the polygonal columnar wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40F)

FIG. 8A to FIG. 8D are drawings in relation to the wavelength conversion member 40F. In a plan view perpendicular to the light-emitting surface, the light-emitting surface of the wavelength conversion portion 41 has a shape having a first region that is constant in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a quadrangular shape. Note that, in the wavelength conversion member 40F as illustrated, the first direction is the same direction as the positive X-direction.

The maximum width in the second direction of the light incident surface of the wavelength conversion portion 41 is smaller than the minimum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example: using a frustum-shaped wavelength conversion portion having an upper surface and a lower surface each having the same shape as the light-emitting surface, the lower surface being smaller than the upper surface; and subjecting the frustum-shaped wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40G)

FIG. 9A to FIG. 9D are drawings in relation to the wavelength conversion member 40G. In a plan view perpendicular to the light-emitting surface, the light-emitting surface of the wavelength conversion portion 41 has a shape having a first region increasing in width in the second direction from the point closest to the semiconductor laser element 20 toward the first direction. Adjusting the shape of the light-emitting surface can adjust a distribution of the light emitted from the light-emitting device. Also, the light-emitting surface of the wavelength conversion portion 41 is a circular shape. Note that, in the wavelength conversion member 40G as illustrated, the first direction is the same direction as the positive X-direction.

The maximum width in the second direction of the light incident surface of the wavelength conversion portion 41 is larger than the minimum width in the second direction in the first region of the light-emitting surface of the wavelength conversion portion 41.

The maximum width in the second direction of the light incident surface of the wavelength conversion portion 41 is smaller than the maximum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and subjecting the polygonal columnar wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40H)

FIG. 10A to FIG. 10D are drawings in relation to the wavelength conversion member 40H. In a plan view perpendicular to the light-emitting surface, the light-emitting surface of the wavelength conversion portion 41 has a shape having a first region increasing in width in the second direction from the point closest to the semiconductor laser element 20 toward the first direction. Adjusting the shape of the light-emitting surface can adjust a distribution of the light emitted from the light-emitting device. Also, the light-emitting surface of the wavelength conversion portion 41 is a circular shape. Note that, in the wavelength conversion member 40H as illustrated, the first direction is the same direction as the positive X-direction.

The maximum width in the second direction of the light incident surface of the wavelength conversion portion 41 is larger than the minimum width in the second direction in the first region of the light-emitting surface of the wavelength conversion portion 41.

The maximum width in the second direction of the light incident surface of the wavelength conversion portion 41 is smaller than the maximum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and subjecting the polygonal columnar wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region increasing in width in the second direction from the point closest to the semiconductor laser element 20 toward the first direction. The shape of the outer edge of the upper surface of the reflective portion 43 is a circle.

(Light-Emitting Device 1 Including Wavelength Conversion Member 40I)

FIG. 11A to FIG. 11D are drawings in relation to the wavelength conversion member 40I. In a plan view perpendicular to the light-emitting surface, the light-emitting surface of the wavelength conversion portion 41 has a shape having a first region increasing in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a hexagonal shape. Note that, in the wavelength conversion member 40I as illustrated, the first direction is the same direction as the positive X-direction.

The maximum width in the second direction of the light incident surface of the wavelength conversion portion 41 is larger than the minimum width in the second direction in the first region of the light-emitting surface of the wavelength conversion portion 41.

The maximum width in the second direction of the light incident surface of the wavelength conversion portion 41 is smaller than the maximum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and subjecting the polygonal columnar wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40J)

FIG. 12A to FIG. 12D are drawings in relation to the wavelength conversion member 40J. In a plan view perpendicular to the light-emitting surface, the light-emitting surface of the wavelength conversion portion 41 has a shape having a first region increasing in width in the second direction from the point closest to the semiconductor laser element 20 toward the first direction. Adjusting the shape of the light-emitting surface can adjust a distribution of the light emitted from the light-emitting device. Also, the light-emitting surface of the wavelength conversion portion 41 is a triangular shape. Note that, in the wavelength conversion member 40J as illustrated, the first direction is the same direction as the positive X-direction.

The maximum width in the second direction of the light incident surface of the wavelength conversion portion 41 is larger than the minimum width in the second direction in the first region of the light-emitting surface of the wavelength conversion portion 41.

The maximum width in the second direction of the light incident surface of the wavelength conversion portion 41 is smaller than the maximum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and subjecting the polygonal columnar wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40K)

FIG. 13A to FIG. 13D are drawings in relation to the wavelength conversion member 40K. In a plan view perpendicular to the light-emitting surface, the light-emitting surface of the wavelength conversion portion 41 has a shape having a first region increasing in width in the second direction from the point closest to the semiconductor laser element 20 toward the first direction. Adjusting the shape of the light-emitting surface can adjust a distribution of the light emitted from the light-emitting device. Also, the light-emitting surface of the wavelength conversion portion 41 is a triangular shape. Note that, in the wavelength conversion member 40K as illustrated, the first direction is the same direction as the positive X-direction.

The maximum width in the second direction of the light incident surface of the wavelength conversion portion 41 is larger than the minimum width in the second direction in the first region of the light-emitting surface of the wavelength conversion portion 41.

The maximum width in the second direction of the light incident surface of the wavelength conversion portion 41 is smaller than the maximum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and subjecting the polygonal columnar wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region increasing in width in the second direction from the point closest to the semiconductor laser element 20 toward the first direction. The shape of the outer edge of the upper surface of the reflective portion 43 is a triangle.

(Light-Emitting Device 1 Including Wavelength Conversion Member 40L)

FIG. 14A to FIG. 14D are drawings in relation to the wavelength conversion member 40L. In a plan view perpendicular to the light-emitting surface, the light-emitting surface of the wavelength conversion portion 41 has a shape having a first region increasing in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a quadrangular shape. Note that, in the wavelength conversion member 40L as illustrated, the first direction is the same direction as the positive X-direction.

The maximum width in the second direction of the light incident surface of the wavelength conversion portion 41 is the same as the minimum width in the second direction in the first region of the light-emitting surface of the wavelength conversion portion 41.

The maximum width in the second direction of the light incident surface of the wavelength conversion portion 41 is smaller than the maximum width in the second direction in the first region of the light-emitting surface of the wavelength conversion portion 41.

At a position that passes through a point at which the light lying along the optical axis from the semiconductor laser element 20 is incident on the light incident surface of the wavelength conversion portion 41, the width in the second direction of the light incident surface of the wavelength conversion portion 41 is smaller than the minimum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and subjecting the polygonal columnar wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40M)

FIG. 15A to FIG. 15D are drawings in relation to the wavelength conversion member 40M. In a plan view perpendicular to the light-emitting surface, the light-emitting surface of the wavelength conversion portion 41 has a shape having a first region increasing in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a quadrangular shape. Note that, in the wavelength conversion member 40M as illustrated, the first direction is the same direction as the positive X-direction.

The maximum width in the second direction of the light incident surface of the wavelength conversion portion 41 is smaller than the minimum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example: using a frustum-shaped wavelength conversion portion having an upper surface and a lower surface each having the same shape as the light-emitting surface, the lower surface being smaller than the upper surface; and subjecting the frustum-shaped wavelength conversion portion to half-cut dicing so as to cut the lower surface while avoiding reaching the upper surface.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

Although the embodiments of the present invention have been described above, the wavelength conversion member 40 may be changed to any of the following wavelength conversion member 40N to 40Q. In the following, a light-emitting device 1 of Modified Example including a wavelength conversion member 40N, a light-emitting device 1 of Modified Example including a wavelength conversion member 40P, and a light-emitting device 1 of Modified Example including a wavelength conversion member 40Q will be described.

(Light-Emitting Device 1 Including Wavelength Conversion Member 40N)

FIG. 16A to FIG. 16D are drawings in relation to the wavelength conversion member 40N. In a plan view perpendicular to the light-emitting surface, the light-emitting surface of the wavelength conversion portion 41 has a shape having a first region that is constant in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a quadrangular shape. Note that, in the wavelength conversion member 40N as illustrated, the first direction is the same direction as the positive X-direction.

The maximum width in the second direction of the light incident surface of the wavelength conversion portion 41 is smaller than the minimum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example: using a frustum-shaped wavelength conversion portion having an upper surface and a lower surface each having the same shape as the light-emitting surface, the lower surface being smaller than the upper surface; and dicing the lower surface of the frustum-shaped wavelength conversion portion obliquely outward.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40P)

FIG. 17A to FIG. 17D are drawings in relation to the wavelength conversion member 40P. In a plan view perpendicular to the light-emitting surface, the light-emitting surface of the wavelength conversion portion 41 has a shape having a first region increasing in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a hexagonal shape. Note that, in the wavelength conversion member 40P as illustrated, the first direction is the same direction as the positive X-direction.

The maximum width in the second direction of the light incident surface of the wavelength conversion portion 41 is larger than the minimum width in the second direction in the first region of the light-emitting surface of the wavelength conversion portion 41.

The maximum width in the second direction of the light incident surface of the wavelength conversion portion 41 is smaller than the maximum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and dicing the lower surface of the polygonal columnar wavelength conversion portion obliquely outward.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

(Light-Emitting Device 1 Including Wavelength Conversion Member 40Q)

FIG. 18A to FIG. 18D are drawings in relation to the wavelength conversion member 40Q. In a plan view perpendicular to the light-emitting surface, the light-emitting surface of the wavelength conversion portion 41 has a shape having a first region decreasing in width in the second direction from the side closest to the semiconductor laser element 20 toward the first direction. Adjusting the shape of the light-emitting surface can adjust a distribution of the light emitted from the light-emitting device. Also, the light-emitting surface of the wavelength conversion portion 41 is a triangular shape. Note that, in the wavelength conversion member 40Q as illustrated, the first direction is the same direction as the positive X-direction.

The maximum width in the second direction of the light incident surface of the wavelength conversion portion 41 is larger than the minimum width in the second direction in the first region of the light-emitting surface of the wavelength conversion portion 41.

The maximum width in the second direction of the light incident surface of the wavelength conversion portion 41 is the same as the maximum width in the second direction in the first region of the light-emitting surface of the wavelength conversion portion 41.

At a position that passes through a point at which the light lying along the optical axis from the semiconductor laser element 20 is incident on the light incident surface of the wavelength conversion portion 41, the maximum width in the second direction of the light incident surface of the wavelength conversion portion 41 is smaller than the maximum width in the second direction in the first region of the light-emitting surface of the wavelength conversion portion 41.

In a plan view perpendicular to the light-emitting surface of the wavelength conversion portion 41, a region of at least 80% or more of the light incident surface of the wavelength conversion portion 41 is included in an inner region of the outer edge of the light-emitting surface (the inner region excluding the outer edge). Also, in the plan view perpendicular to the light-emitting surface of the wavelength conversion portion 41, a region of at least 80% or more of the light incident surface of the wavelength conversion portion 41 is included in an inner region of the first region (the inner region excluding the outer edge of the first region). Such a shape can be simply produced because the shape can be formed by, for example, using a polygonal columnar wavelength conversion portion having an upper surface and a lower surface each having the same shape as the light-emitting surface and dicing the lower surface of the polygonal columnar wavelength conversion portion obliquely outward.

The shape of the outer edge of the upper surface of the reflective portion 43 is, in a plan view perpendicular to the upper surface, a shape having a second region that is constant in width in the second direction from the point closest to the semiconductor laser element 20 toward the first direction. The shape of the outer edge of the upper surface of the reflective portion 43 is a quadrangle.

Although embodiments of the present invention have been described above, the light-emitting device according to the present invention should not be construed as being strictly limited to the light-emitting device of each embodiment. In other words, the present invention can be realized even without the limitations to the outer shape or structure of the light-emitting device disclosed in each embodiment. The present invention is applicable even without necessary or sufficient possession of all of the components described above. For example, when the claims omit some of the components of the light-emitting device disclosed in the embodiment, some degree of freedom in design by persons skilled in the art is accepted for those components; e.g., substitutions, omissions, deformation of shapes, and changes of materials; accordingly, the inventions recited in the claims are defined to be applicable.

The light-emitting device described in each embodiment can be used in, for example, lighting equipment (e.g., smart lights and indirect lighting), automotive headlights, head mounted displays, projectors, and displays.

What is claimed is:

1. A light-emitting device comprising:
- a semiconductor laser element;
- a wavelength conversion member; and
- a package; wherein:
- the wavelength conversion member comprises:
  - a wavelength conversion portion, and
  - a reflective portion;
- the wavelength conversion portion includes:
  - a light incident surface that is a lateral surface on which light emitted from the semiconductor laser element is incident, and
  - a light-emitting surface that is an upper surface from which light converted in wavelength is emitted, the light converted in wavelength being obtained by converting a wavelength of the light emitted from the semiconductor laser element;
- the reflective portion is provided on a surface of the wavelength conversion portion that does not include the light incident surface and does not include the light-emitting surface, and the reflective portion is configured to reflect:
  - the light emitted from the semiconductor laser element and incident on the wavelength conversion portion, and
  - the light converted in wavelength by the wavelength conversion portion;
- the package includes a disposition region where the semiconductor laser element and the wavelength conversion member are disposed, and defines an inner space in which the semiconductor laser element and the wavelength conversion member are disposed;
- the wavelength conversion member is disposed at a position away in a first direction from a position at which the semiconductor laser element is disposed; and
- the light-emitting surface has a shape that, in a plan view perpendicular to the light-emitting surface, has a first region decreasing in width in a second direction perpendicular to the first direction from a side closest to the semiconductor laser element toward the first direction.

2. The light-emitting device according to claim 1, wherein, in the plan view perpendicular to the light-emitting surface, a region of at least 80% or more of the light incident surface is included in a region away in the first direction from an imaginary line that passes through a point of the light-emitting surface closest to the semiconductor laser element and that is parallel to the second direction.

3. The light-emitting device according to claim 2, wherein, in the plan view perpendicular to the light-emitting surface, the region of at least 80% or more of the light incident surface is included in an inner region of an outer edge of the light-emitting surface.

4. The light-emitting device according to claim 3, wherein, in the plan view perpendicular to the light-emitting surface, the region of at least 80% or more of the light incident surface is included in an inner region of the first region.

5. The light-emitting device according to claim 1, wherein a maximum width of the light incident surface in the second direction is larger than a minimum width in the second direction in the first region of the light-emitting surface.

6. The light-emitting device according to claim 5, wherein a maximum width of the light incident surface in the second direction is the same as a maximum width in the second direction in the first region of the light-emitting surface.

7. The light-emitting device according to claim 6, wherein the light incident surface has such a shape that a maximum width thereof in a third direction is larger than the maximum width thereof in the second direction, the third direction being perpendicular to the first direction and the second direction.

8. The light-emitting device according to claim 1, wherein the light incident surface is a triangular shape or a quadrangular shape.

9. The light-emitting device according to claim 1, wherein a maximum width of the light incident surface in the second direction is same as a minimum width in the second direction in the first region of the light-emitting surface.

10. The light-emitting device according to claim 2, wherein a maximum width of the light incident surface in the second direction is same as a minimum width in the second direction in the first region of the light-emitting surface.

11. The light-emitting device according to claim 3, wherein a maximum width of the light incident surface in the second direction is same as a minimum width in the second direction in the first region of the light-emitting surface.

12. The light-emitting device according to claim 4, wherein a maximum width of the light incident surface in the second direction is same as a minimum width in the second direction in the first region of the light-emitting surface.

13. The light-emitting device according to claim 1, wherein a maximum width of the light incident surface in the second direction is smaller than a minimum width in the second direction in the first region of the light-emitting surface.

14. The light-emitting device according to claim 2, wherein a maximum width of the light incident surface in the second direction is smaller than a minimum width in the second direction in the first region of the light-emitting surface.

15. The light-emitting device according to claim 3, wherein a maximum width of the light incident surface in the second direction is smaller than a minimum width in the second direction in the first region of the light-emitting surface.

16. The light-emitting device according to claim 4, wherein a maximum width of the light incident surface in the second direction is smaller than a minimum width in the second direction in the first region of the light-emitting surface.

* * * * *